United States Patent
Tonouchi

(10) Patent No.: US 10,766,198 B2
(45) Date of Patent: Sep. 8, 2020

(54) INFORMATION PROCESSING APPARATUS FOR DETECTING EXPECTED TROUBLE, THREE-DIMENSIONAL MODELING SYSTEM, AND COMPUTER READABLE MEDIUM STORING INFORMATION PROCESSING PROGRAM FOR THE SAME

(71) Applicant: FUJI XEROX CO., LTD., Tokyo (JP)

(72) Inventor: Masaharu Tonouchi, Yokohama (JP)

(73) Assignee: Fuji Xerox Co., Ltd., Tokyo (JP)

( * ) Notice: Subject to any disclaimer, the term of this patent is extended or adjusted under 35 U.S.C. 154(b) by 406 days.

(21) Appl. No.: 15/792,951

(22) Filed: Oct. 25, 2017

(65) Prior Publication Data

US 2018/0200958 A1    Jul. 19, 2018

(30) Foreign Application Priority Data

Jan. 18, 2017    (JP) .................................. 2017-007073

(51) Int. Cl.
| | | |
|---|---|---|
| *B29C 64/393* | (2017.01) | |
| *G06T 17/00* | (2006.01) | |
| *G06T 19/00* | (2011.01) | |
| *B29C 64/147* | (2017.01) | |
| *B33Y 50/02* | (2015.01) | |
| *G06F 30/00* | (2020.01) | |

(52) U.S. Cl.
CPC ............ *B29C 64/393* (2017.08); *G06T 17/00* (2013.01); *G06T 19/00* (2013.01); *B29C 64/147* (2017.08); *B33Y 50/02* (2014.12); *G06F 30/00* (2020.01); *G06T 2219/008* (2013.01)

(58) Field of Classification Search
CPC ..... G06F 17/50; B29C 64/393; B29C 64/147; G06T 19/00; G06T 17/00; B33Y 50/02
USPC ............................................................ 703/1
See application file for complete search history.

(56) References Cited

U.S. PATENT DOCUMENTS

2011/0222081 A1\* 9/2011 Yi ........................... G06T 17/00
358/1.9

FOREIGN PATENT DOCUMENTS

| JP | 2002-248692 | 9/2002 |
|---|---|---|
| JP | 2002-292752 | 10/2002 |
| JP | 2002292752 A | * 10/2002 |
| JP | 2016-151997 | 8/2016 |

OTHER PUBLICATIONS

Abstract and machine translation of JP 2002-248692.
Abstract and machine translation of JP 2002-292752.
Abstract and machine translation of JP 2016-151997.

\* cited by examiner

*Primary Examiner* — Cedric Johnson
(74) *Attorney, Agent, or Firm* — Fildes & Outland, P.C.

(57) ABSTRACT

An information processing apparatus includes: a detection unit that detects, from slice data of each page of slice data of plural pages obtained by slicing 3D data using plural respective planes, expected trouble that may occur when 3D modeling post-processing is performed on a recording medium on which a slice image has been formed based on the slice data of the page; and a warning unit that warns a user about the detection of the expected trouble.

8 Claims, 20 Drawing Sheets

```
011110
010010
010010
011110
000000
```

```
void fill(int y, int x){
        if(canvas[y][x] != 2){
                canvas[y][x]=2;
                printf("~(x=%d,y=%d)~¥n", x, y);
                printCanvas();
        }
        if(y != 0){
                if (canvas[y-1][x]==0) /* Does "0" exist above? */
                        fill(y-1,x); /* If it exists, perform recursive
                                        calling at its coordinates. */
        }
        if(x < (MAX_X - 1) ){
                if (canvas[y][x+1]==0) /* on the right */
                        fill(y,x+1);
        }
        if(y < (MAX_Y - 1) ){
                if (canvas[y+1][x]==0) /* below */
                        fill(y+1,x);
        }
        if(x != 0){
                if (canvas[y][x-1]==0) /* on the left */
                        fill(y,x-1);
        }
}
```

INFORMATION PROCESSING APPARATUS FOR DETECTING EXPECTED TROUBLE, THREE-DIMENSIONAL MODELING SYSTEM, AND COMPUTER READABLE MEDIUM STORING INFORMATION PROCESSING PROGRAM FOR THE SAME

CROSS-REFERENCE TO RELATED APPLICATIONS

This application is based on and claims priority under 35 USC 119 from Japanese Patent Application No. 2017-007073 filed on Jan. 18, 2017.

BACKGROUND

Technical Field

The present invention relates to an information processing apparatus, a three-dimensional modeling system, and a computer readable medium storing an information processing program.

SUMMARY

According to an aspect of the invention, there is provided an information processing apparatus comprising: a detection unit that detects, from slice data of each page of slice data of plural pages obtained by slicing 3D data using plural respective planes, expected trouble that may occur when 3D modeling post-processing is performed on a recording medium on which a slice image has been formed on the basis of the slice data of the page; and a warning unit that warns a user about the detection of the expected trouble.

BRIEF DESCRIPTION OF THE DRAWINGS

Exemplary embodiments of the present invention will be described in detail based on the following figures, wherein.

DESCRIPTION OF SYMBOLS

Figure 1A:
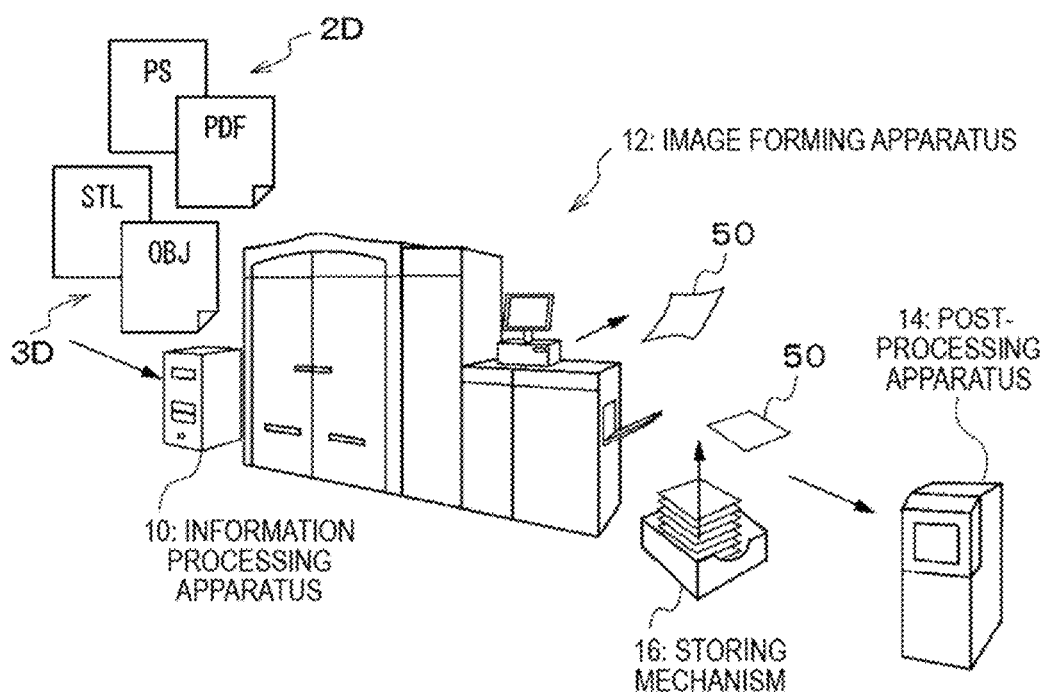
FIGS. 1A and 1B are a schematic diagram and a block diagram, respectively, illustrating the configuration of one example 3D modeling system according to an exemplary embodiment of the present invention.

10: Information processing apparatus
12: Image forming apparatus
14: 3D modeling post-processing apparatus (post-processing apparatus)
16: Storing mechanism
18: Communication line
20: Glue applying unit
22: Cutting-out unit
24: Compression bonding unit
26: Conveyance path
30: Information processing unit
31: External apparatus
32: Operation unit
34: Display
36: Communication unit
38: Memory
40: File format conversion unit
42: Raster processing unit
44: 3D data processing unit
45: Slice processing unit
46: Image data generation unit
47: Control data generation unit
48: Trouble detection unit
49: Trouble warning unit
50: Recording medium
51: Cutting print data
52: Lamination component
53: Unnecessary portion
54: Cutting line
55: Cutting-out region
56: Colored region
57: Body region 58: Glue application region
59: Separation region
60: Warning picture
62: Warning
64: Notice
70: Setting picture
72: Setting portion
74: Button
76: Button
80: Selection picture
81: Warning
82: Question
83: Display
84: Button
85: Button
D: Removal target
M: 3D model
Mn: Slice image
P: 3D modeled object

DETAILED DESCRIPTION

Exemplary embodiments of the present invention will be hereinafter described in detail with reference to the drawings.
<Three-Dimensional Modeling System>
(Overall Configuration)

First, a three-dimensional (3D) modeling system according to the exemplary embodiment of the invention will be described. The 3D modeling system according to the exemplary embodiment manufactures a three-dimensional (3D) modeled object by a sheet lamination 3D modeling method. In the sheet lamination 3D modeling method, plural pieces of slice data are generated by slicing three-dimensional (3D) data of a 3D model by plural planes and a series of slice images is formed on plural sheet-like recording media such as paper sheets on the basis of the plural pieces of slice data. Then 3D modeling post-processing is performed on the plural recording media on which the series of slice images is formed; for example, the plural recording media are laminated by subjecting them to certain processing. How to generate slice data will be described later. The term "series of slice images" means that the slice images correspond to the respective pieces of slice data generated on the basis of the 3D data.

Figure 1B:
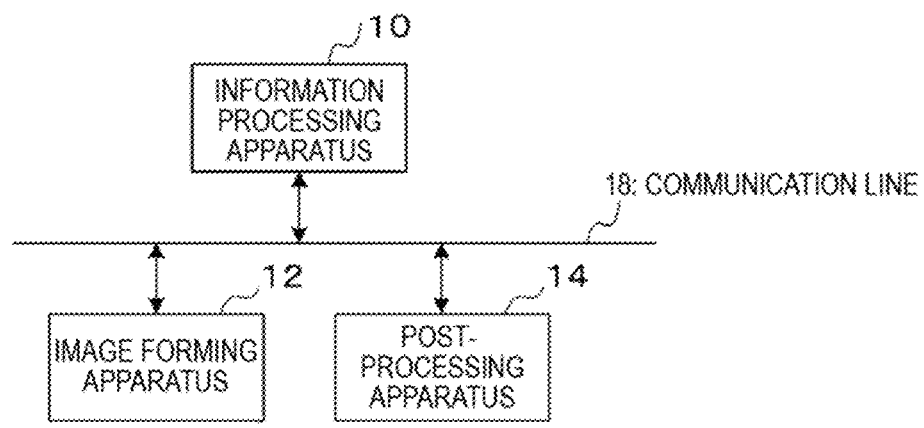
Figure 2:
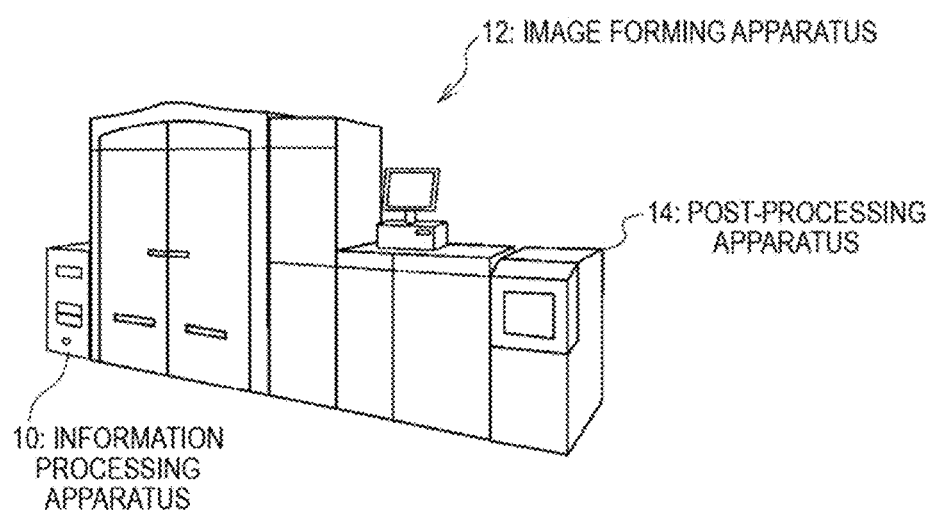
FIG. 2 is a schematic diagram, showing the configuration of another example 3D modeling system according to the exemplary embodiment.

FIGS. 1A and 1B are a schematic diagram and a block diagram, respectively, illustrating the configuration of one example 3D modeling system according to the exemplary embodiment. FIG. 2 is a schematic diagram showing the configuration of another example 3D modeling system according to the exemplary embodiment.

As shown in FIG. 1A, the one example 3D modeling system according to the exemplary embodiment is equipped with an information processing apparatus 10, an image forming apparatus 12, and a 3D modeling post-processing apparatus 14. As shown in FIG. 1B, the information processing apparatus 10, the image forming apparatus 12, and the 3D modeling post-processing apparatus 14 are connected to each other so as to be able to communicate with each other through a communication line 18. In the following description, the 3D modeling post-processing apparatus 14 will be abbreviated as a "post-processing apparatus 14."

The image forming apparatus 12 forms an image on a recording medium 50 on the basis of raster image data. The raster image data are an example of the "image formation information". In the exemplary embodiment, the image forming apparatus 12 is not an apparatus dedicated to 3D modeling. The image forming apparatus 12 functions as an ordinary image forming apparatus when it is instructed to perform image formation base on two-dimensional (2D) image data. As such, the information processing apparatus 10 performs different kinds of information processing depending on which of image formation based on 2D image data and 3D modeling based on 3D data it should work for.

The image forming apparatus 12 is an apparatus for forming an image on a recording medium by electrophotography, for example. In this case, the image forming apparatus 12 includes a photoreceptor drum, a charging device, an exposing device, a developing device, a transfer device, a fusing device, etc. The charging device charges the photoreceptor drum. The exposing device exposes the charged surface of the photoreceptor drum to light that reflects an image to be formed. The developing device develops, with toner, an electrostatic latent image formed on the photoreceptor drum by the exposure. The transfer device transfers a toner image formed on the photoreceptor drum by exposure to a recording medium. The fusing device fuses the toner image transferred to the recording medium. The image forming apparatus 12 may be an inkjet recording apparatus, in which case the image forming apparatus 12 includes an inkjet recording head for ejecting ink droplets toward a recording medium according to an image to be formed and other components.

If instructed to work for 3D modeling based on 3D data, the information processing apparatus 10 generates plural pieces of slice data on the basis of the 3D data. Then, to enable formation of a series of raster images, the information processing apparatus 10 generates a series of raster image data on the basis of the plural pieces of slice data and outputs the generated series of raster image data to the image forming apparatus 12. On the other hand, if instructed to work for image formation based on 2D image data, the information processing apparatus 10 generates raster image data on the basis of the 2D image data and outputs the generated raster image data of a 2D image to the image forming apparatus 12.

If instructed to work for 3D modeling based on 3D data, the information processing apparatus 10 further generates a series of control data on the basis of the plural pieces of slice data. The series of control data is data for allowing the post-processing apparatus 14 to perform 3D modeling post-processing. As described later, control data include control data that specify a cutting line along which to cut out a lamination component from a recording medium and control data that specify a glue application region where glue is applied to the recording medium.

The post-processing apparatus 14 performs 3D modeling post-processing on recording media 50 on which a series of slice images are formed. As shown in FIG. 1A, the post-processing apparatus 14 may be disposed so as not to share a recording medium conveyance path with the image forming apparatus 12 (offline or near-line). Alternatively, as shown in FIG. 2, the post-processing apparatus 14 may be disposed so as to share a recording medium conveyance path with the image forming apparatus 12 (in-line).

Where the post-processing apparatus 14 does not share a conveyance path with the image forming apparatus 12, plural recording media 50 on which a series of slice images is formed are stacked in order of formation of the slice images and stored in a storing mechanism 16 such as a stacker. The bundle of (i.e., stacked) plural recording media 50 is taken out of the storing mechanism 16 and transferred to the post-processing apparatus 14 together. On the other hand, where the post-processing apparatus 14 shares a conveyance path with the image forming apparatus 12, recording media 50 on which respective slice images are formed are fed to the post-processing apparatus 14 one by one.

(Sheet Lamination 3D Modeling)

Figure 3A:
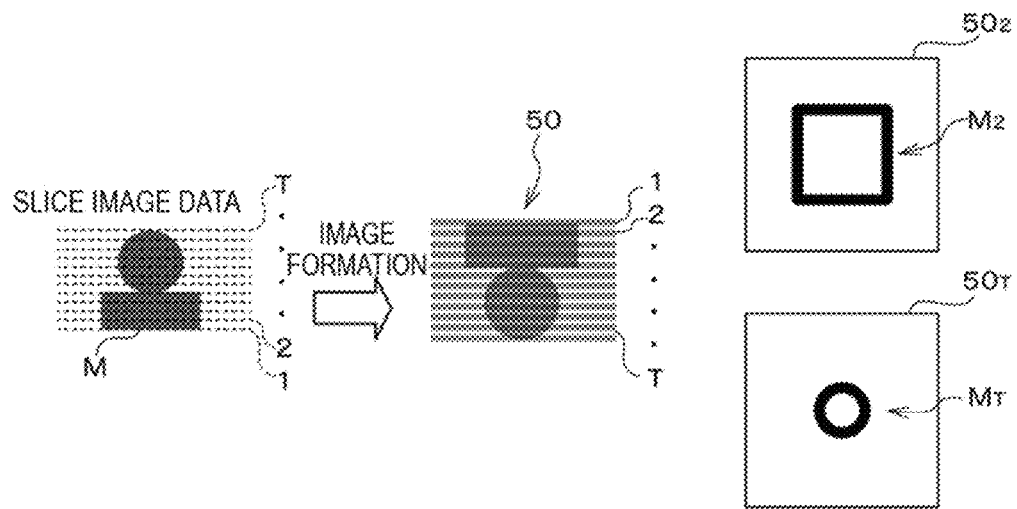
FIG. 3A is a schematic diagram illustrating an image forming process of sheet lamination 3D modeling.
Figure 3B:
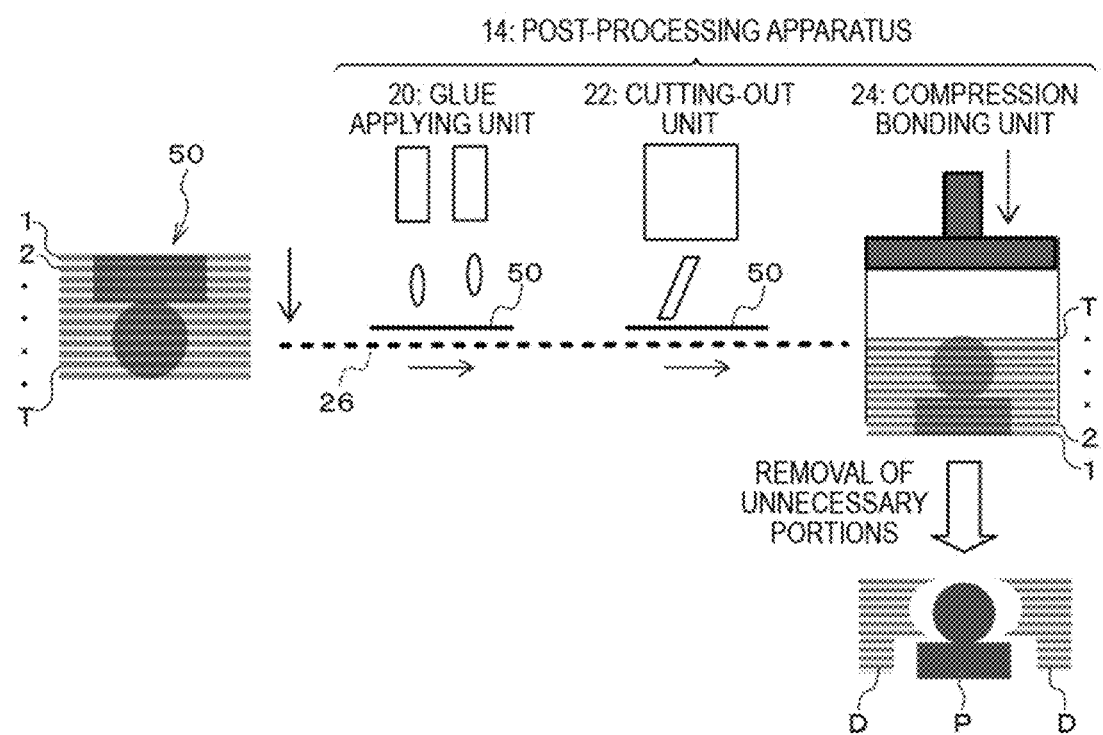
FIG. 3B is a schematic diagram illustrating a post-processing process of the sheet lamination 3D modeling.

Next, individual processes of sheet lamination 3D modeling will be described. FIG. 3A is a schematic diagram illustrating an image forming process of the sheet lamination 3D modeling, and FIG. 3B is a schematic diagram illustrating a post-processing process of the sheet lamination 3D modeling.

First, raster image data of slice images are generated as shown in FIG. 3A. Although the details will be described later, the information processing apparatus 10 generates plural pieces of slice data on the basis of 3D data of a 3D model M. The slice data represent sectional images obtained by slicing the 3D model M by slicing planes. In the exemplary embodiment, T (first to Tth) pieces of slice data are generated using T (first to Tth) slicing planes. Each of the T pieces of slice data is converted into YMCK raster image data for formation of a corresponding one of T (first to Tth) slice images.

Next, as shown in FIG. 3A, slice images are formed on respective recording media. The image forming apparatus 12 forms a series of slice images on recording media 50 on the basis of the series of raster image data. The plural recording media $50_1$ to $50_T$ on which the series of slice images is formed are stacked in order of formation of the slice images. An nth slice image is formed on an nth recording medium $50_n$, n being a number that is one of "1" to "T."

In the illustrated example, the T (first to Tth) slice images are formed in order that the number representing each of their, descends from "T" to "1." The plural recording media $50_1$ to $50_T$ are stacked in order that the number representing each of them descends from "T" to "1" with the recording medium $50_T$ on which the Tth slice image is formed being the lowest layer. Since the plural recording media $50_1$ to $50_T$ are stacked in this order, the post-processing process that follows is supplied with the plural recording media $50_1$ to $50_T$ in order that the number representing each of them ascends from "1" to "T." As such, the image forming apparatus 12 forms T slice images on recording media 50 in the order that is reverse to the order in which the post-processing apparatus 14 performs post-processing.

Subsequently, as shown in FIG. 3B, the recording media 50 on which the respective slice images are formed are subjected to post processing. In the exemplary embodiment, the post-processing apparatus 14 is equipped with a glue applying unit 20 which performs a glue applying operation, a cutting-out unit 22 which performs a cutting-out operation, and a compression bonding unit 24 which performs a compression bonding operation. The glue applying unit 20, the cutting-out unit 22, and the compression bonding unit 24 are arranged, in this order along a conveyance path 26 for feeding recording media 50. The post-processing apparatus 14 acquires a series of control data corresponding to the series of slice images from the information processing apparatus 10.

Figure 4A:
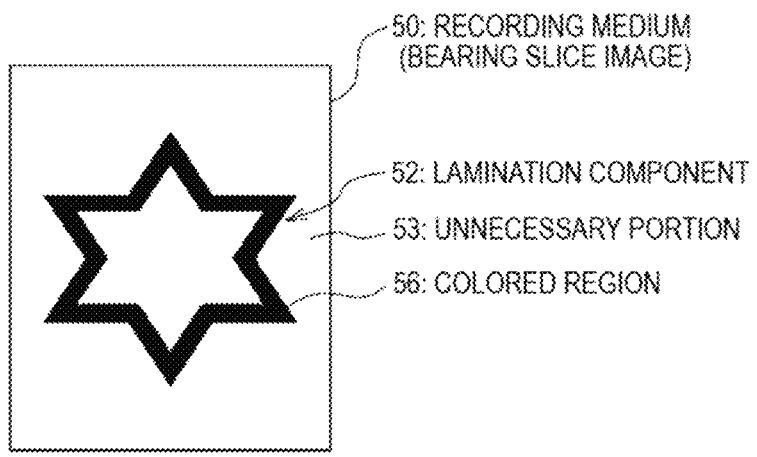
FIGS. 4A, 4B and 4C are schematic diagrams showing a slice image formed on a recording medium.
Figure 4B:
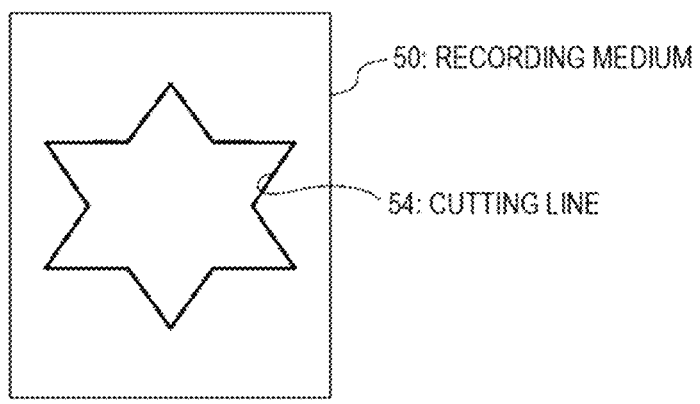
Figure 4C:
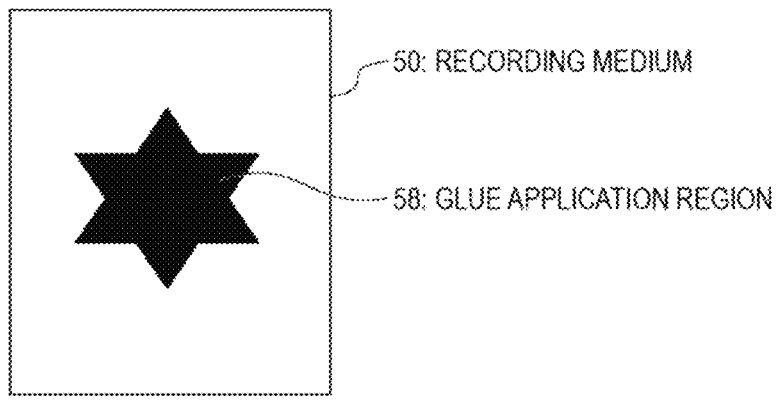

The slice image will now be described. FIGS. 4A-4C are schematic diagrams showing an example slice image formed on a recording medium 50. As shown in FIG. 4A, a slice image formed on a recording medium 50 consists of a lamination component 52 to become part of a 3D modeled object when subjected to lamination and an unnecessary portion 53. The lamination component 52 has a colored region 56 which is a peripheral region having a preset width.

As shown in FIG. 4B, the outer circumferential line of the lamination component 52 is a cutting line 54 along which to cut out the lamination component 52 from the recording medium 50.

As shown in FIG. 4C, a glue application region 58 is set inside the outer circumferential line (cutting line 54) of the lamination component 52; for example, the glue application region 58 is the region located inside and adjoining the colored region 56. Although glue may be applied to the entire surface of the recording medium 50 including the unnecessary portion 53, setting the glue application region 58 as a region located inside the outer circumferential line of the lamination component 52 makes it easier to remove removal target portions D (see FIG. 3B) than in the case that glue is applied to the entire surface of the recording medium 50. Furthermore, setting the glue application region 58 as a region located inside the outer circumferential line of the lamination component 52 prevents an event that glue sticks out of the lamination component 52 in a compression, bonding operation that is performed after glue application.

A width of the colored region 56 and a retreat width of the glue application region 58 from the outer circumferential line of the lamination component 52 may be set when a user inputs instructions about 3D modeling by, for example, displaying a setting picture on a display 34 of the information processing apparatus 10 and receiving settings from the user through an operation unit 32. Alternatively, preset initial settings may be employed.

Control data include control data that specify the cutting line 54 and control data that specify the glue application region 58. For example, the control data that specify the cutting line 54 are coordinate data of points located on a route of the cutting line 54, The control data that specify the glue application region 58 are coordinate data of points existing in the glue application region 58.

Recording media 50 are supplied to the glue applying unit 20 one by one from a bundle of plural recording media 50. The glue applying unit 20 applies glue to the glue application region 58 of each recording medium 50 according to control data that specify the glue application region 58. For example, the glue applying unit 20 may be equipped with a glue ejection head for ejecting glue, which is moved in a lamination direction (Z direction) and directions parallel with, the plane of the recording medium 50 (X and Y directions). Glue is applied to the glue application region 58 of the recording medium 50 as the glue ejection head scans the glue application region 58 while ejecting glue. Upon completion of the glue applying operation, the recording medium 50 is supplied to the cutting-out unit 22.

The cutting-out unit 22 forms a cut in each recording medium 50 along the cutting line 54 according to control data that specify the cutting line 54. For example, the cutting-out unit 22 may be a cutter having a blade. The blade of the cutter is moved in the lamination direction (Z direction) and the directions parallel with the plane of the recording medium 50 (X and Y directions). A cut is formed in the recording medium 50 by moving the blade of the cutter in the X and Y directions while pressing it against the recording medium 50.

A cutting depth is determined by adjusting the position of the blade of the cutter in the lamination direction. The cutting depth may be such that the cut does not reach the back surface of each recording medium 50, in which case the lamination component 52 is not separated from the recording medium 50 and hence can be prevented from being lost in the process of conveyance of the recording medium 50.

It suffices that the cutter have a function of forming a cut along the cutting line 54 of a recording medium 50, and the cutter is not limited to a mechanical cutter that presses a blade against a recording medium 50. For example, the cutter may be an ultrasonic cutter that forms a cut by applying ultrasonic waves to a recording medium 50 or a laser cutter that forms a cut by irradiating a recording medium 50 with laser light.

Instead of forming a cut in a recording medium 50, the cutting-out unit 22 may form plural perforations in a recording medium 50 along the cutting line 54, Where plural perforations are formed, the lamination component 52 is kept connected to the recording medium 50 and hence can be prevented from being lost in the process of conveyance of the recording medium 50 even more reliably.

Each recording medium 50 that has been subjected to the cutting operation is supplied to the compression bonding unit 24. The compression bonding unit 24 stacks received recording media 50 successively. The plural recording media $50_1$ to $50_T$ are stacked in order that the number representing each of them ascends from "1" to "T." The compression bonding unit 24 compression-bonds the bundle of stacked plural recording media 50 together by pressing it in the lamination direction. During the pressure bonding, each of the plural glue-applied recording media $50_1$ to $50_T$ is bonded to the recording media 50 located immediately above and below in the glue application regions 58.

The recording media 50 that have been subjected to the cutting-out operation are composed of the lamination components 52 that constitute a 3D modeled object P as a result of the lamination and the unnecessary portions 53. In this state, the unnecessary portions 53 are not removed and remain parts of the recording media 50. The unnecessary portions 53 serve as a support member for supporting the 3D modeled object P that is a laminate of the lamination components 52. After completion of the lamination operation of the compression bonding unit 24, removal target portions D are separated from the laminate of the lamination components 52 of the recording media 50, whereby the 3D modeled object P are separated.

Figure 5B:
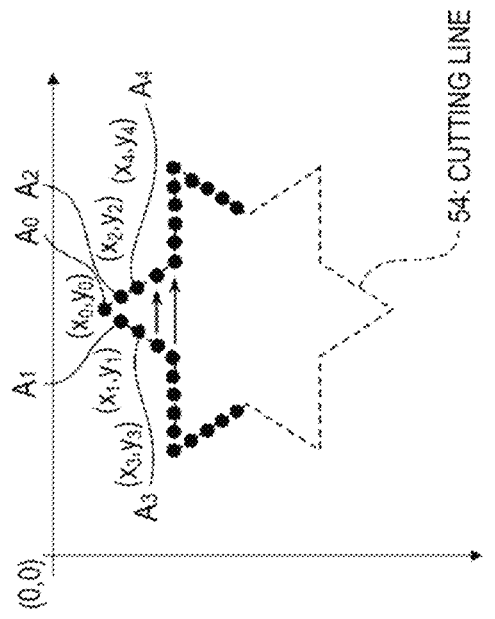
FIGS. 5A and 5B are schematic diagrams illustrating examples of control data that specify a cutting line.
Figure 5A:
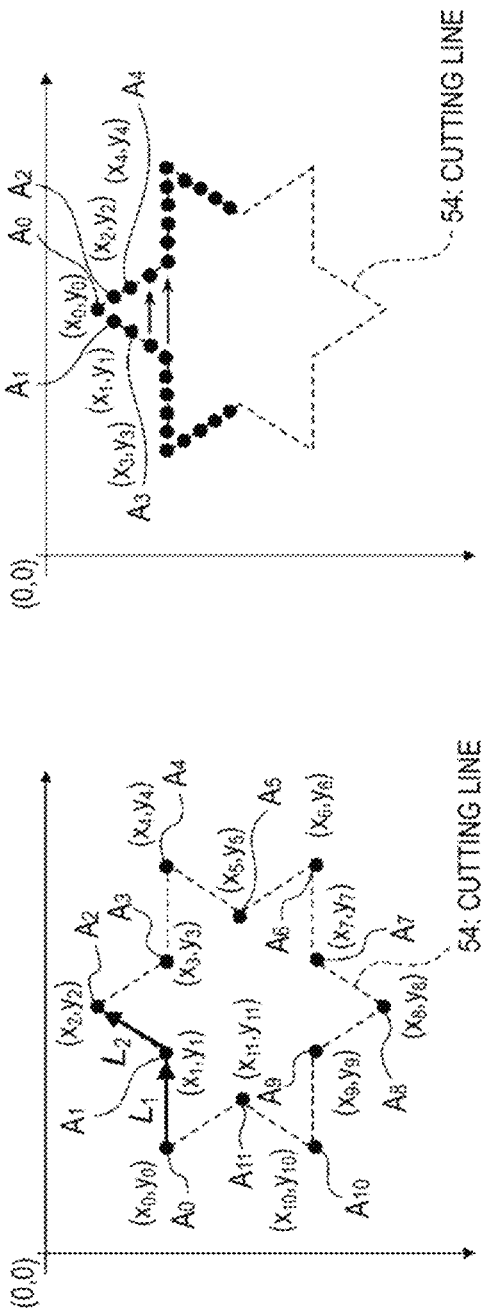
Figure 6A:
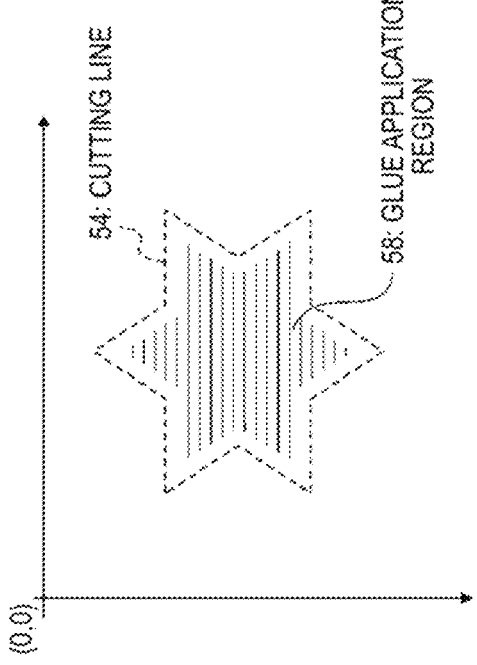
FIGS. 6A and 6B are schematic diagrams illustrating examples of control data that specify a glue application region.
Figure 6B:
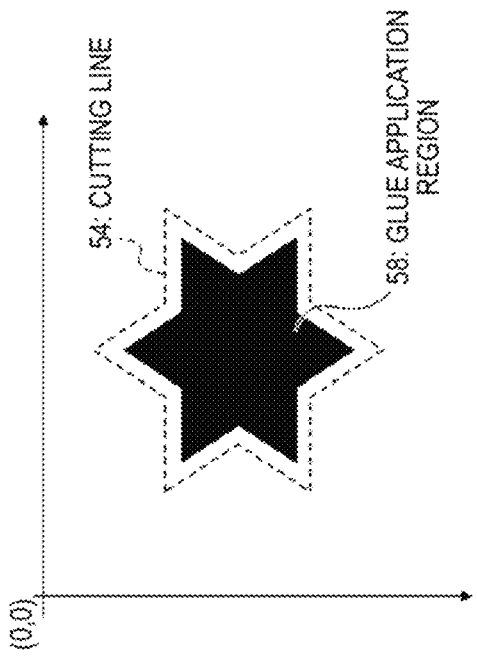

Next, examples of control data will be described. FIGS. 5A and 5B are schematic diagrams illustrating examples of control data that specify a cutting line 54. FIGS. 6A and 6B are schematic diagrams illustrating examples of control data that specify a glue application region 58. As described later, slice data include coordinate data of apices of intersection regions where polygons intersect a slicing plane. The intersection regions exist along the outer circumferential, line of a lamination component 52. Thus, as shown in FIG. 5A, coordinate data of respective points located on the route of a cutting line 54, such as coordinates $(x_0, y_0)$ of point $A_0$, are made control data that specify the cutting line 54.

In the illustrated example, a star-shaped lamination component 52 has twelve apices $A_0$ to $A_{11}$. For example, if point $A_0$ is employed as a start point, the cutting line 54 is specified by tracing the points $A_0$ to $A_{11}$ in order of $A_0 \rightarrow A_2 \rightarrow A_3 \rightarrow A_4 \rightarrow A_5 \rightarrow A_6 \rightarrow A_7 \rightarrow A_8 \rightarrow A_9 \rightarrow A_{10} \rightarrow A_{11}$.

As shown in FIG. 5B, where plural perforations are to be formed, coordinate data of respective perforations located on the route of a cutting line 54 are made control data that specify the cutting line 54. For example, if point $A_0$ is employed as a start point, the cutting line 54 is specified by tracing points of the perforations in order of their formation (e.g., $A_0 \rightarrow A_2 \rightarrow A_3 \rightarrow A_4$ . . . ).

As shown in FIG. 6A, coordinate data of respective points of a glue application region 58 are made control data that specify the glue application region 58. The glue application region 58 is one size smaller than the lamination component 52 and is set inside the outer circumferential line of the lamination component 52. A glue application region 58 may be specified by toy reducing the image of the lamination component 52. In this case, the glue application region 58 is disposed so that its center of gravity coincides with that of the image of the lamination component 52. Coordinate data of respective points of the glue application region 58 are determined on the basis of its retreat width from the outer circumferential line of the lamination component 52 and coordinate data of points located on the route of the cutting line 54.

As shown in FIG. 6B, it is not necessary to apply glue over the entire glue application region 58. Glue may be applied in selected portions of the glue application region 58. Furthermore, the glue density need not be constant over the entire glue application region 58. Where the glue density is set variable, the glue density may be set higher in a peripheral region of the glue application region 58 than in its central region.

The origin of control data that specify a cutting line 54 and the origin of control data that specify a glue application region 58 are set the same as the origin of slice image formation. Where the post-processing apparatus 14 has an image reading function, a procedure may be employed that the image forming apparatus 12 forms a mark image indicating the origin of control data on a recording medium 50 together with a slice image and the post-processing apparatus 14 acquires position information indicating the origin of control data by reading the mark image.

The form of control data is not limited to coordinate data. For example, control data may be image data in which a cutting line 54, a glue application region 58, etc. are represented by figures or images, such as binary raster image data. In the case of binary raster image data, in the example shown in FIG. 4B, the pixel values of the cutting line 54 are made "1" and those of the other regions are made "0." In the example shown in FIG. 4C, the pixel values of the glue application region 58 are made "1" and those of the other regions are made "0." For example, the glue ejection head of the glue applying unit 20 ejects glue toward a recording medium 50 when the pixel value is equal to "1" and does not eject glue toward the recording medium 50 when the pixel value is equal to "0."

<Information Processing Apparatus 10>

Figure 7:
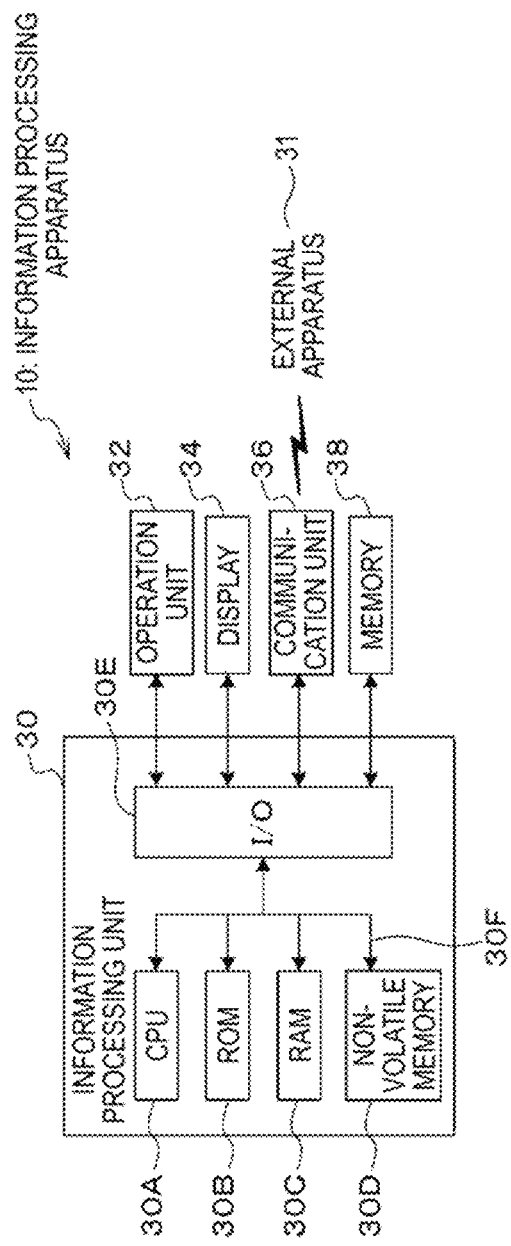
FIG. 7 is a block diagram showing an example electrical configuration of an information processing apparatus according to the exemplary embodiment.

Next, the information processing apparatus 10 according to the exemplary embodiment of the invention will be described. FIG. 7 is a block diagram showing the electrical configuration of the information processing apparatus 10 according to the exemplary embodiment. As shown in FIG. 7, the information processing apparatus 10 is equipped with an information processing unit 30, an operation unit 32 for receiving a user manipulation, a display 34 for displaying information to a user, a communication unit 36 for communicating with an external apparatus 31, and a memory 38 such as an external storage device. The operation unit 32, the display 34, the communication unit 36, and the memory 38 are connected to an input/output interface (I/O) 30E of the information processing unit 30.

The information processing unit 30 is equipped with a CPU (central processing unit) 30A, a ROM (read-only memory) 30B, a RAM (random access memory) 30C, a nonvolatile memory 30D, and the I/O 30E. The CPU 30A, the ROM 30B, the RAM 30C, the nonvolatile memory 30D, and the I/O 30E are connected to each other by a bus 30F. The CPU 30A reads out a program from the ROM 30B and executes the program using the RAM 30C as a working area.

The operation unit 32 receives a user manipulation through a mouse, a keyboard, etc. The display 34 displays various pictures to a user using a display device. The communication unit 36 communicates with the external apparatus 31 through a wired or wireless communicate line. For example, the communication unit 36 functions as an interface for communicating with the external apparatus 31 such as a computer that is connected to a network such as the Internet. The memory 38 is equipped with a storage device such as a hard disk drive.

Figure 8:
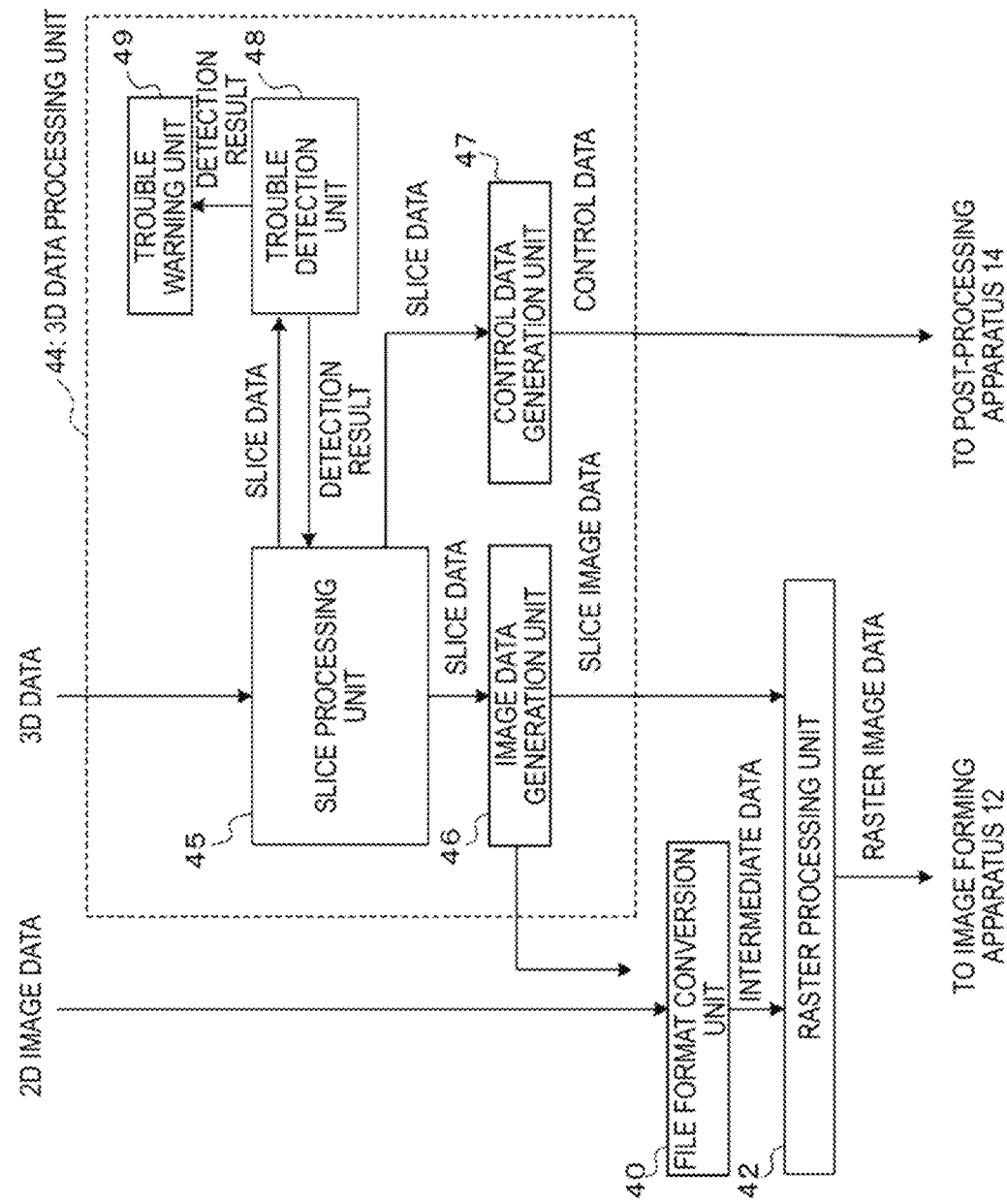
FIG. 8 is a block diagram showing an example functional configuration of the information processing apparatus according to the exemplary embodiment.

FIG. 8 is a block diagram showing the functional configuration of the information processing apparatus 10 according to the exemplary embodiment. As shown in FIG. 8, the information processing apparatus 10 is equipped with a file format conversion unit 40, a raster processing unit 42, a 3D data processing unit 44, and a control data memory.

When receiving data written in a page description language (hereinafter referred to as "PDL data"), the file format conversion unit 40 converts the received PDL data into intermediate data.

The raster processing unit 42 generates raster image data by rasterizing the intermediate data produced by the file format conversion unit 40. Furthermore, the raster processing unit 42 generates raster image data by rasterizing slice image data generated by an image data generation unit 46 (described later). The raster processing unit 42 is an example of the "first output unit" and "second output unit".

The 3D data processing unit 44 generates slice image data and control data by processing acquired 3D data. Specifically, the 3D data processing unit 44 is equipped with a slice processing unit 45, an image data generation unit 46, a control data generation unit 47, a trouble detection unit 48, and a trouble warning unit 49, In the exemplary embodiment, the trouble detection unit 48 and the trouble warning unit 49 are examples of the "detection unit" and "warning unit", respectively.

The slice processing unit 45 generates slice data on the basis of the acquired 3D data. The trouble detection unit 48 generates raster image data called cutting print data from the slice data generated by the slice processing unit 45. For example, the term "cutting print data" means binary raster image data in which a cutting-out region which is a kind of lamination component 52 shown in FIG. 4A is represented by on-pixels. The trouble detection unit 48 defects expected trouble, if any, in post-processing on the basis of the generated cutting print data and communicates a detection result to the slice processing unit 45 and the trouble warning unit 49. The term "trouble" means trouble that obstructs normal execution of a post-processing process, such as a thin-line region or a separation region (described later).

The slice processing unit 45 outputs the generated slice data to each of the image data generation unit 46 and the control data generation unit 47 if no expected trouble is detected, and discards the generated slice data if expected trouble is detected. If expected trouble is detected, the trouble warning unit 49 warns a user about detection of the expected trouble by displaying a warning picture or emitting a warning sound. Although in the exemplary embodiment slice data are discarded if expected trouble is detected, whether to discard or leave slice data may be left to a user by displaying proper options in a warning picture.

The image data generation unit 46 generates slice image data from the slice data generated by the slice processing unit 45, and outputs the generated slice image data to the raster processing unit 42. The control data generation unit 47 generates control data on the basis of the slice data generated by the slice processing unit 45, and outputs the generated control data to the post-processing apparatus 14.

(2D Data Processing)

Two-dimensional data processing on 2D image data will be described below. When image formation based on 2D image data is commanded, the 2D image data are data that have been acquired as PDL data. The PDL data are converted by the file format conversion unit 40 into intermediate data, which are output to the raster processing unit 42. The intermediate data are rasterized by the raster processing unit 42 into raster image data of 2D images, which are output to the image forming apparatus 12.

The intermediate data are interval data produced by dividing each of objects (e.g., font characters, graphic figures, and image data) that are image elements of each page image into intervals of respective raster scanning lines. Each piece of interval data includes sets of coordinates of the two ends of the interval concerned and pieces of information indicating pixel values of respective pixels in the interval. The data transfer rate in the information processing apparatus 10 is increased because the PDL data are converted into the intermediate data and then the latter are transferred.

(3D Data Processing)

Three-dimensional data processing which is performed on 3D data will be described below. When instructed to work for 3D modeling based on 3D data, the information processing apparatus 10 acquires 3D data of a 3D model M. The slice processing unit 45 generates a series of slice data on the basis of the 3D data, and outputs the generated series of slice data to the trouble detection unit 48. If no expected trouble is detected by the trouble detection unit 48, the slice processing unit 45 outputs the slice data to each of the image data generation unit 46 and the control data generation unit 47. The 3D data and the slice data will be described below in detail.

For example, the 3D data of the 3D model M are OBJ format. 3D data (hereinafter referred to as "OBJ data"). In the case of OBJ data, the 3D model M is expressed as a set of polygons (triangles). Alternatively, the 3D data may be of another format such as the STL format. Since STL format 3D data have no color information, color information is added when STL format 3D data are used.

The following description will be directed to the case that, the 3D data are OBJ data. The OBJ data include an OBJ file relating to shape data and an MTL file relating to color information. In the OBJ file, surface numbers specific to respective polygons (triangles), coordinate data of the apices of the polygons, etc. are defined so as to be correlated with the respective polygons, in the MTL file, pieces of color information are defined so as to be correlated with the respective polygons.

Planes that are parallel with a ground surface (XY plane) on which the 3D model M is placed are employed as slicing planes. For example, a lowest layer of the 3D model M is set as a first slicing plane. Slice data are generated every time the slicing surface is shifted by a predetermined lamination pitch (distance) p in a lamination direction (Z-axis direction).

The lowest slicing plane is given a number "1" and the slicing plane number is increased by "1" every time the slicing plane is shifted. The example shown in FIG. 3A has T slicing planes having numbers "1" to "T." Slice data represent sectional images obtained by slicing the 3D model M by the slicing planes, respectively. More specifically, each piece of slice data represents a sectional image of the 3D model M in the form of a slicing plane number, coordinate data of the apices of intersection regions where polygons intersect the slicing plane, and pieces of color information that are set for the respective polygons that intersect the slicing plane. T pieces of slice data (first to Tth slice data) are generated by the T respective slicing planes.

The image data generation unit 46 generates slice image data on the basis of slice data of each page generated by the slice processing unit 45. Slice data of each page is converted into slice image data of a file format such as JPEG. The slice image data are page-by-page data for formation of one slice image per one-page data. In generating slice image data of each page, a colored region (s) may be added so as to be reflected in a corresponding slice image. The generated series of slice image data is output to the raster processing unit 42.

The raster processing unit 42 generates raster image data by rasterizing the slice image data obtained from the image data generation unit 46, and outputs the generated raster image data to the image forming apparatus 12.

Alternatively, the image data generation unit 46 may be configured so as to cause generation of intermediate data. In this case, the image data generation unit 46 generates PDL data on the basis of the slice data generated by the slice processing unit 45, and outputs the generated PDL data to the file format conversion unit 40. The file format conversion unit 40 converts the PDL data into intermediate data, and outputs the intermediate data to the raster processing unit 42. The raster processing unit 42 generates raster image data of a slice image by rasterizing the intermediate data, and outputs the generated raster image data to the image forming apparatus 12.

The control data generation unit 47 generates a series of control data on the basis of the slice data generated by the slice processing unit 45, and outputs the generated series of control data to the post-processing apparatus 14. The series of control data generated by the information processing apparatus 10 may be stored in a memory (not shown), which may be provided in either the information processing apparatus 10 or the post-processing apparatus 14. In this case, the series of control data is read out from the memory (not shown) and used in the post-processing apparatus 14.

The memory for storing a series of control data may be a computer-readable, portable storage medium such as a USB (Universal Serial Bus) memory. In this case, a series of control data generated by the information processing apparatus 10 is stored in the computer-readable, portable storage medium. The series of control data stored in this storage medium is read out from it by a data reading mechanism such as a drive provided in the information processing apparatus 10 or the post-processing apparatus 14 and used in the post-processing apparatus 14.

<Information Processing Program>

Figure 9:
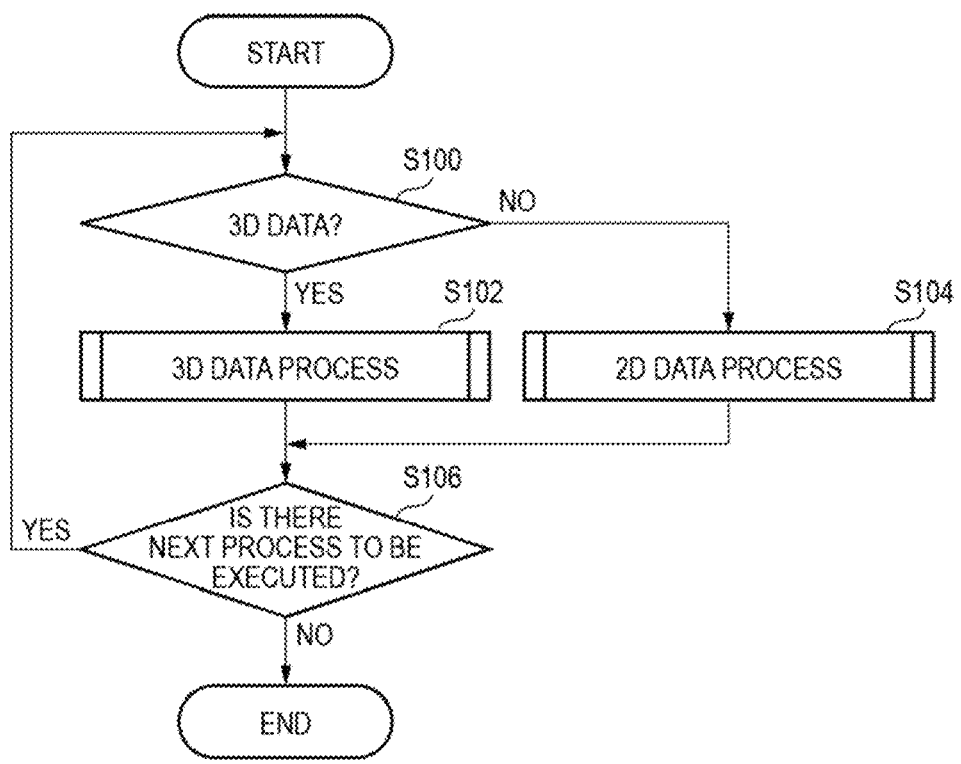
FIG. 9 is a flowchart showing an example processing procedure of an information processing program according to the exemplary embodiment.

Next, an information processing program according to the exemplary embodiment will be described. FIG. 9 is a flowchart showing an example processing procedure of the information processing program according to the exemplary embodiment. The information processing program is stored in the ROM 30B of the information processing apparatus 10. The information processing program is read out from the ROM 30B and executed by the CPU 30A of the information processing apparatus 10. Execution of the information processing program is started upon reception of an image formation instruction or a 3D modeling instruction from a user.

Although the exemplary embodiment is directed to the case that the information processing program is stored in the ROM 30B of the information processing apparatus 10 in advance, the invention is not limited to this case. For example, the information processing program may be provided being stored in a computer-readable, portable storage medium such as a magneto-optical disc, a CD-ROM (compact disc-read only memory), or a USB memory or provided over a network.

First, at step S100, the CPU 30A judges whether data relating to an instruction are 3D data. If 3D modeling based on 3D data is commanded, the CPU 30A executes the process shown in step S102. If not, the CPU 30A executes the process shown in step S104, that is, performs the above-described 2D data processing.

At step S106, the CPU 30A judges whether there is a next process to foe executed. If receiving an instruction to perform 2D image formation or 3D modeling during execution of the 3D data processing or 2D data processing, the CPU 30A executes the process shown in step S100 (steps S100-S106 are executed again) because there is a next process to be executed. If judging at step S106 that there is no next process to be executed, the CPU 30A finishes the execution of the information processing program.

(Thin-Line Region)

Figure 10:
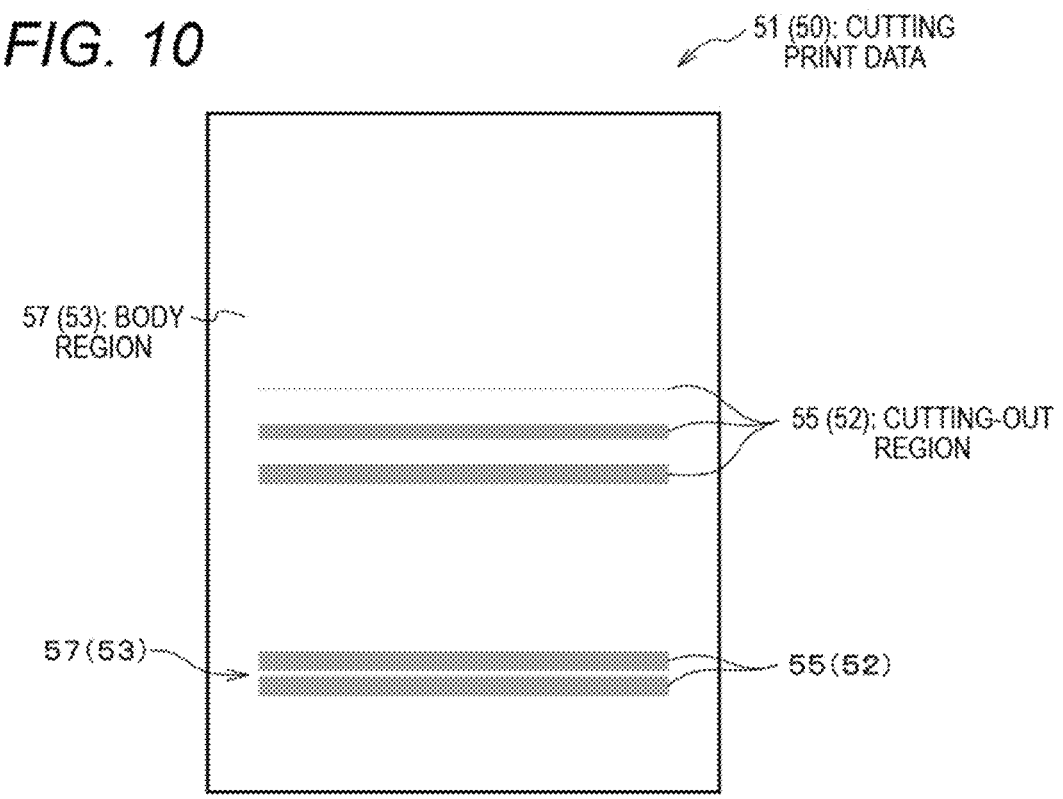
FIG. 10 is a schematic diagram illustrating thin-line regions which are detection targets in a first exemplary embodiment of the present invention.

The term "thin-line region" which means a detection target will be described below. FIG. 10 is a schematic diagram illustrating thin-line regions which are detection targets in the first exemplary embodiment. As shown in FIG. 10, raster image data called cutting print data (51) are binary raster image data in which cutting-out regions 55 each of which is a kind of lamination component 52 shown in FIG. 4A are represented by on-pixels. The cutting-out regions 55 are regions to be cut out of a recording medium 50. The region other than the cutting-out regions 55 is a body region 57 to remain after the cutting. The body region 57 corresponds to the unnecessary portion 53 shown in FIG. 4A and is represented by off-pixels in the cutting print data 51.

FIG. 10 shows two kinds of thin-line regions. A first kind of thin-line region is a cutting-out region 55 itself which is like a thin line. The term "like a thin line" means that the width of the region concerned is smaller than or equal to a threshold value. As described later, the threshold value is set by a user. A cutting-out region 55 like a thin line may cause trouble in a post-processing process that, for example, the cutting-out region 55 cannot be cut out from the recording medium 50, glue cannot be applied to it, a sheet jam occurs in the post-processing apparatus 14, or a manufactured 3D modeled object is rendered unstable. A cutting-out region 55 can be like a thin line even in a case that it consists of dots.

The other kind of thin-line region is a region where a portion of the body region 57 that is interposed between two cutting-out regions 55 is like a thin line. Where a portion of the body region 57 is like a thin line, trouble may occur that that portion is crushed to, for example, leave an unnecessary portion in a manufactured 3D modeled object. Such a portion of the body region 57 is regarded as being like a thin, line even in a case that it consists of dots.

In the exemplary embodiment, such two kinds of thin-line regions in cutting print data are detected as expected trouble. Three-dimensional modeling post-processing is canceled if expected trouble is detected.

(3D Data Process)

Figure 11:
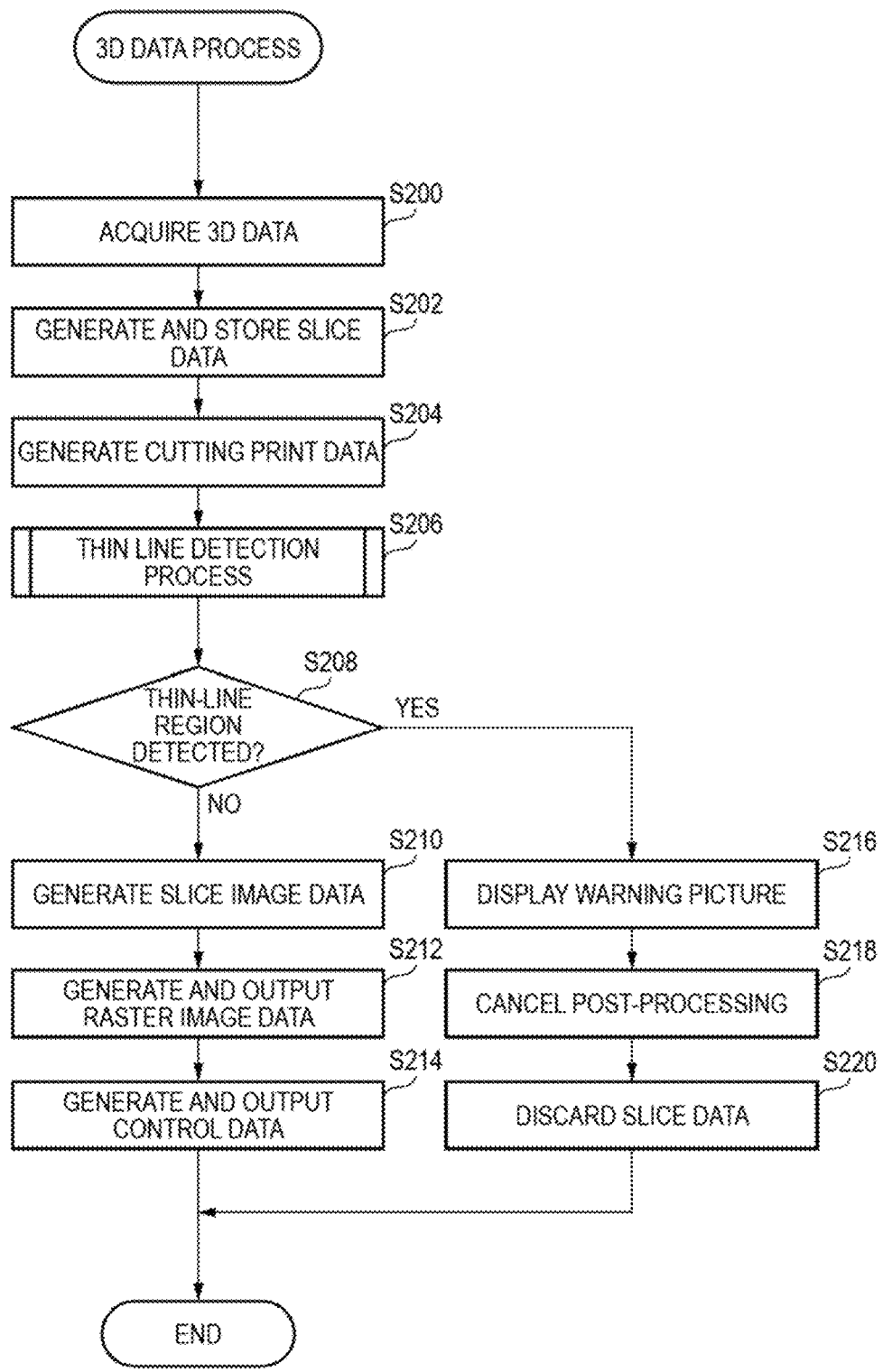
FIG. 11 is a flowchart showing an example processing procedure of a 3D data process according to the first exemplary embodiment.

Next, a 3D data process that corresponds to step S102 shown in FIG. 9 will be described below in detail. FIG. 11 is a flowchart showing an example processing procedure of the 3D data process according to the first exemplary embodiment. A program for executing the 3D data process is stored in the ROM 30B of the information processing apparatus 10 and read out and executed by the CPU 30A of the information processing apparatus 10.

As shown in FIG. 11, at step S200, the CPU 30A of the information processing apparatus 10 acquires 3D data. At step S202, the CPU 30A generates a series of slice data on the basis of the 3D data and stores the generated series of slice data in a memory such as the RAM 30C.

Then the CPU 30A generates a series of cutting print data on the basis of the series of slice data at step S204, and executes a thin line detection process for detecting a thin-line region for cutting print data of each page at step S206. At step S208, the CPU 30A judges whether a thin-line region exists in the series of cutting print data. The thin line detection process will be described later.

If no thin-line region is found, the CPU 30A executes the process shown in step S210 to generate a series of slice image data from the series of slice data. At step S212, the CPU 30A generates a series of raster image data from the series of slice image data and outputs the generated series of raster image data to the image forming apparatus 12.

The image forming apparatus 12 acquires the series of raster image data, and forms slice images on respective recording media 50 on the basis of the raster image data of the respective pages. The recording media 50 on which the slice images have been formed are stacked in order of formation of the slice images and stored in the storing mechanism 16 such as a stacker.

At step S214, the CPU 30A generates a series of control data on the basis of the series of slice data and outputs the generated series of control data to the post-processing apparatus 14. The post-processing apparatus 14 acquires the series of control data, and performs post-processing on the plural recording media 50 on which the slice images are formed, according to the series of control data.

On the other hand, if a thin-line region is detected at step S208, the CPU 30A executes the process shown in step S216 to display a warning picture to a user and thereby warn the user that the thin-line region (expected trouble) has been detected. The CPU 30A cancels the post-processing at step S218, and discards the series of slice image data at step S220. The series of slice data is discarded before generation of slice image data and control data.

(Warning Picture)

Figure 12:
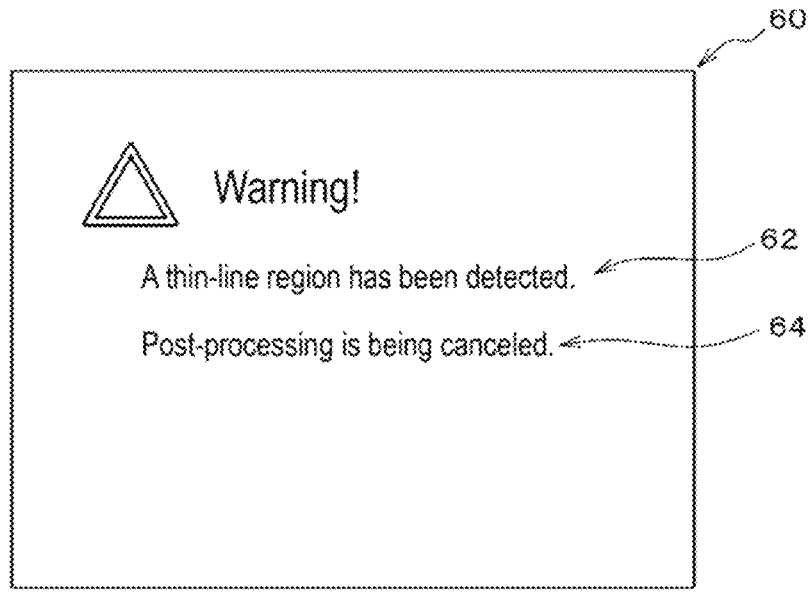
FIG. 12 is a schematic diagram showing an example warning picture.

The warning picture that is displayed at step S216 will be described below. FIG. 12 is a schematic diagram showing an example warning picture. As shown in FIG. 12, the warning picture includes a warning 62 to the effect that a thin-line region (expected trouble) has been detected and a notice 64 that the post-processing has been canceled. In the illustrated example, a warning mark, a character string "Warning!" and a sentence "A thin-line region has been detected" are displayed as the warning 62. A sentence "Post-processing is being canceled" is displayed as the notice 64. Looking at the warning picture, the user recognizes that a thin-line region (expected trouble) has been detected and post-processing has been canceled.

(Thin Line Detection Process)

Figure 13:
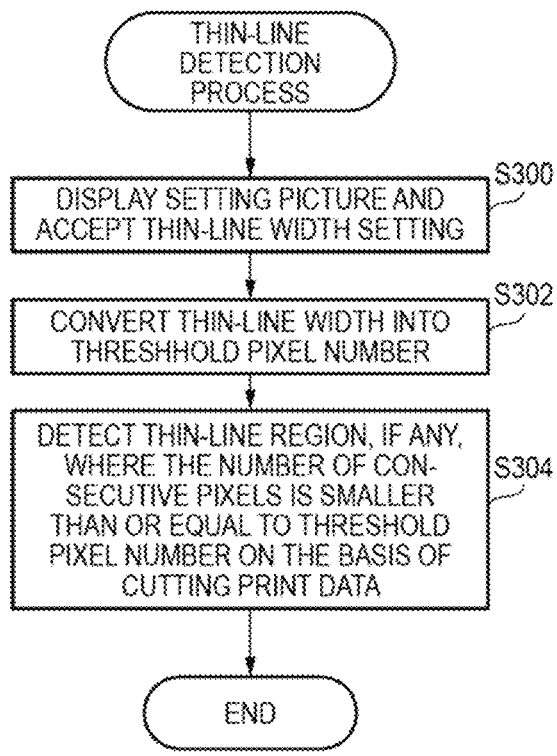
FIG. 13 is a flowchart showing an example processing procedure of a thin line detection process.

Next, the thin line detection process will be described. FIG. 13 is a flowchart showing an example processing procedure of the thin line detection process. As shown in FIG. 13, at step S300, the CPU 30A displays a setting picture to a user and accepts a setting of a thin-line width. At step S302, the CPU 30A converts the thin-line width that was set at step S302 into a threshold pixel number. At step S304, the CPU 30A detects a thin-line region, if any, where the number of consecutive pixels is smaller than or equal to the threshold pixel number on the basis of cutting print data.

Figure 14:
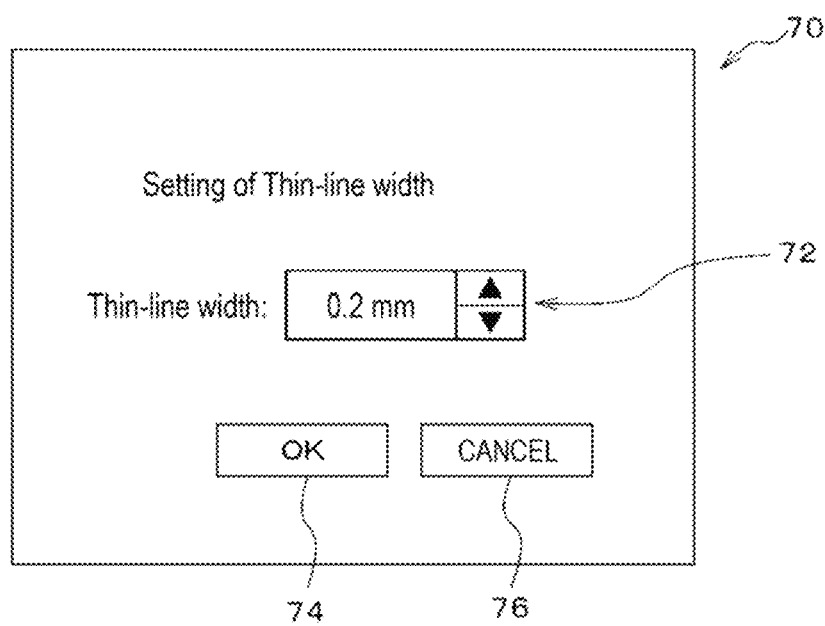
FIG. 14 is a schematic diagram showing an example setting picture through which to set a thin-line width.

The setting picture that is displayed at step S300 will be described below. FIG. 14 is a schematic diagram showing an example setting picture 70 through which to set a thin-line width. As shown in FIG. 14, the setting picture 70 includes a setting portion 72 for setting of a thin-line width, a button 74 for entering a setting, and a button 76 for canceling a setting. In the illustrated example, a box for selecting and setting a thin-line width is displayed as the setting portion 72. The setting value such as "0.2 mm" that is shown in the box is increased or decreased by manipulating buttons such as "▲" and "▼". An "OK" button is displayed as the button 74 for entering a setting, and a "cancel" button is displayed as the button 76 for canceling a setting.

A user sets a threshold thin-line width for detection of a thin-line region. The thin-line width set value is converted into a threshold pixel number. For example, a thin-line width set value "0.2 mm" is converted into a threshold pixel number "1". In this case, a cutting-out region 55 and a portion of a body region 57 that are narrower than one pixel are detected as thin-line regions (see FIG. 10).

Figure 15A:
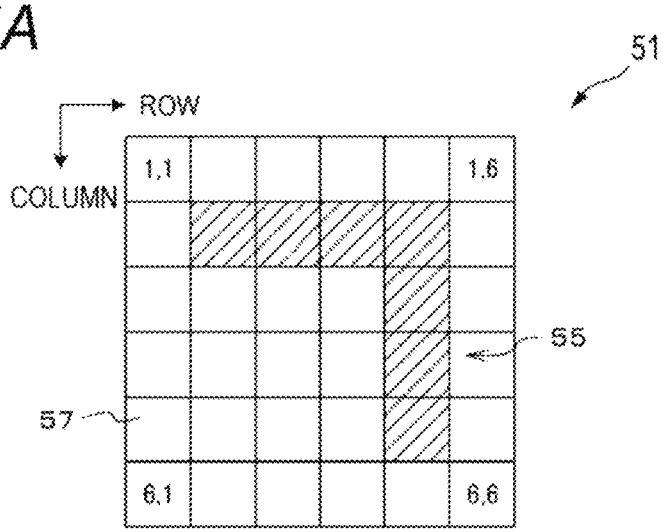
FIGS. 15A, 15B and 15C are schematic diagrams illustrating an example thin-line portion detection method.
Figure 15B:
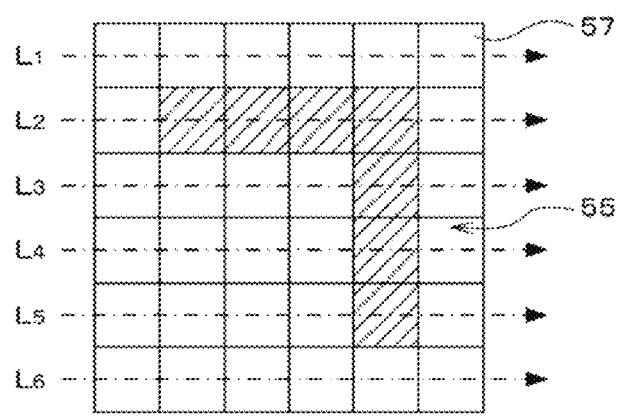
Figure 15C:
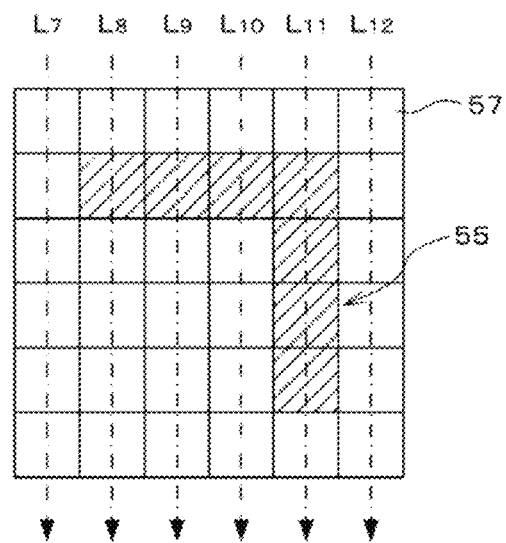

A specific thin-line portion detection method will be described below. FIGS. 15A-15C are schematic diagrams illustrating an example thin-line portion detection method. Assume that as shown in FIG. 15A cutting print data 51 are of an image of 6 pixels (row direction)×6 pixels (column direction). Each pixel is represented by (x, y). A hatched, L-shaped region is a cutting-out region 55 and the region other than the cutting-out region 55 is a body region 57. Hatched pixels are on-pixels and white pixels are off-pixels.

As shown in FIG. 15B, the cutting print data 51 are scanned in the row direction row by row from row L1 to row L6. A row in which the number of consecutive on-pixels or off-pixels is equal to one is detected. The number of consecutive on-pixels is equal to one in each of row L3, row L4, and row L5. The number of consecutive off-pixels is equal to one in each of row L2, row L3, row L4, and row L5. These rows are detected as thin-line regions.

Subsequently, as shown in FIG. 15C, the cutting print data 51 is scanned in the column direction column by column from column L7 to column L12. A column in which the number of consecutive on-pixels or off-pixels is equal to one is detected. The number of consecutive on-pixels is equal to one in each of column L8, column L9, and column L10. The number of consecutive off-pixels is equal to one in each of column L8, column L9, column L10, and column L11. These columns are detected as thin-line regions. The scanning in the row direction and the scanning in the column direction may be performed in the order that is opposite to the above order.

<Exemplary Embodiment 2>

The second exemplary embodiment is different from the first exemplary embodiment in that the detection target is a separation region and that a different process than in the first exemplary embodiment is executed when a separation region is detected. The second exemplary embodiment is the same as the first exemplary embodiment in the other aspects, and hence only the differences will be described below.

(Separation Region)

Figure 16:
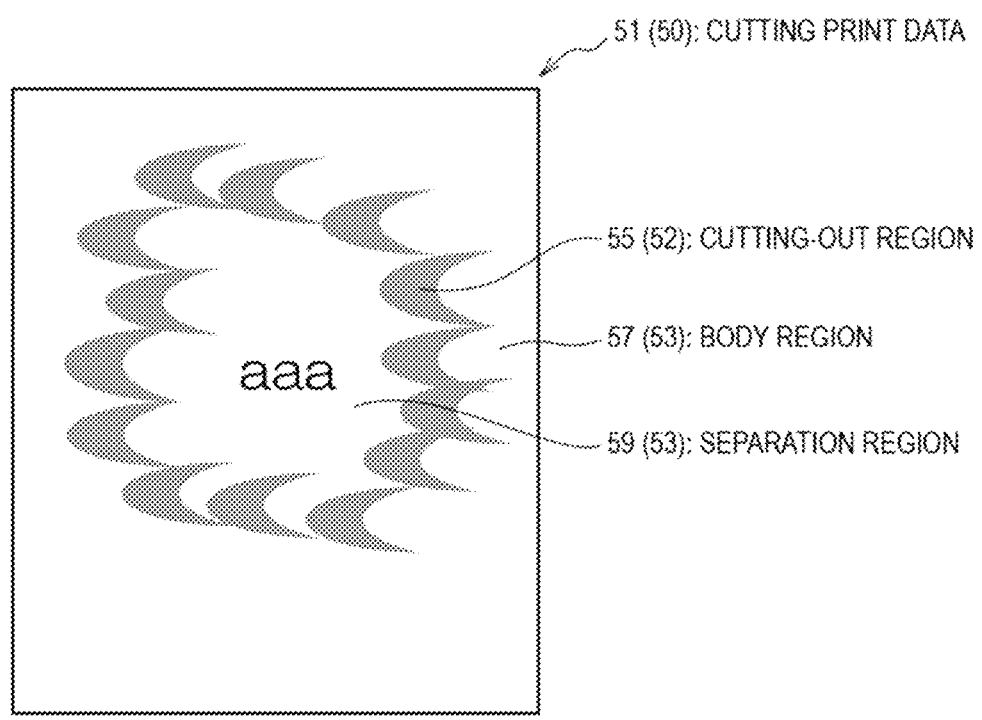
FIG. 16 is a schematic diagram showing a separation region which is a detection target in a second exemplary embodiment of the invention.

The term "separation region" which means a kind of detection target will be described below. FIG. 16 is a schematic diagram showing a separation region which is a detection target in the second exemplary embodiment. As shown in FIG. 16, raster image data called cutting print data (51) are binary raster image data in which a cutting-out region which is a kind of lamination component 52 shown in FIG. 4A is represented by on-pixels.

The cutting-out region 55 is a region to be cut out of a recording medium 50. The regions other than the cutting-out region 55 are a body region 57 to remain after the cutting and a separation region 59 to be separated from the recording media 50. The body region 57 and the separation region 59 correspond the unnecessary portion 53 shown in FIG. 4A and are represented by off-pixels in the cutting print data 51.

Although the separation region 59 is separated from the body region 57, it is not a lamination target unlike the cutting-out region 55. That is, the separation region 59 is a region that may be separated from the recording medium 50 in a state that a user intension as to whether to use it is unknown. Thus, trouble may occur that, for example, the separation region 59 is separated contrary to a user intension.

In the illustrated example, a character string "aaa" exists in the separation region 59. Where as in this case the separation region 59 includes data of an image, characters, a figure, on-pixels indicating the adjoining cutting-out region 55, or the like, it is highly probable that the separation region 59 will be separated contrary to a user intension.

In view of the above, in the exemplary embodiment, a separation region, in cutting print data is detected as what will cause trouble. If such expected trouble is detected, a user is warned about the detection of the separation region (expected trouble) and a selection picture for urging the user to select between cancellation and execution of post-processing is displayed to the user to recognize his or her intension.

(3D Data Process)

Figure 17:
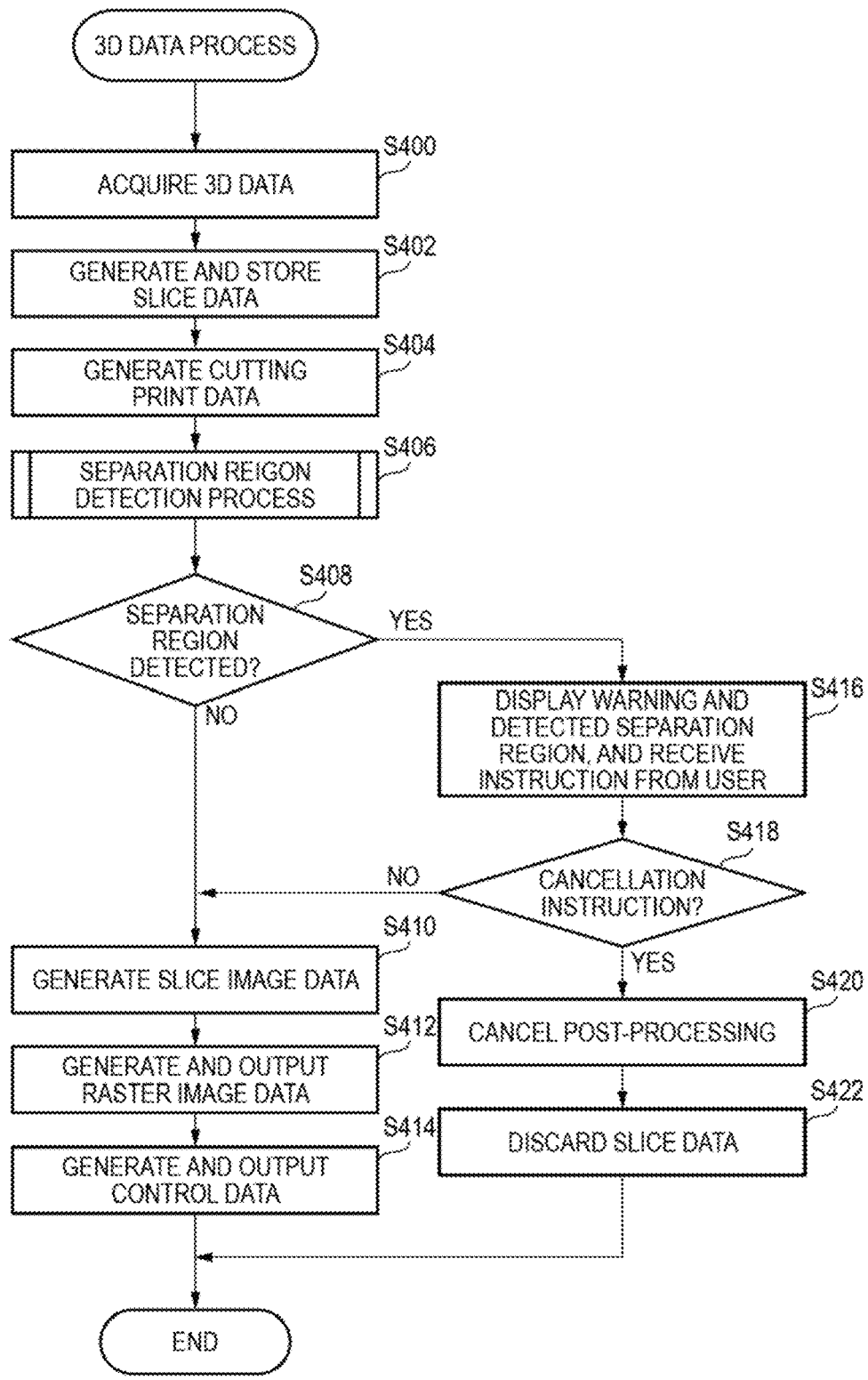
FIG. 17 is a flowchart showing an example processing procedure of a 3D data process according to the second exemplary embodiment.

Next, a 3D data process that corresponds to step S102 shown in FIG. 9 will be described below in detail. FIG. 17 is a flowchart showing an example processing procedure of the 3D data process according to the second exemplary embodiment. A program for executing the 3D data process is stored in the ROM 30B of the information processing apparatus 10 and read out and executed by the CPU 30A of the information processing apparatus 10.

As shown in FIG. 17, at step S400, the CPU 30A of the information processing apparatus 10 acquires 3D data. At step S402, the CPU 30A generates a series of slice data on the basis of the 3D data and stores the generated series of slice data in a memory such as the RAM 30C.

Then the CPU 30A generates a series of cutting print data on the basis of the series of slice data at step S404, and executes a separation region detection process for detecting a separation region for cutting print data of each page at step S406. At step S408, the CPU 30A judges whether a separation region exists in the series of cutting print data. The separation region detection process will be described later.

If no separation region is found, the CPU 30A executes the process shown in step S410 to generate a series of slice image data from the series of slice data. At step S412, the CPU 30A generates a series of raster image data from the series of slice image data and outputs the generated series of raster image data to the image forming apparatus 12.

The image forming apparatus 12 acquires the series of raster image data, and forms slice images on respective recording media 50 on the basis of the raster image data of the respective pages.

At step S414, the CPU 30A generates a series of control data on the basis of the series of slice data and outputs the generated series of control data to the post-processing apparatus 14. The post-processing apparatus 14 acquires the series of control data, and performs post-processing on the plural recording media 50 on which the slice images are formed, according to the series of control data.

If a separation region is detected at step S408, the CPU 30A. executes the process shown in step S416 to display a selection picture to a user to thereby warn the user about the detection of the separation region (expected trouble). The selection picture includes options for urging the user to select between cancellation and execution of post-processing, and the CPU 30A receives an instruction from the user. The user selects between cancellation and execution of post-processing and inputs an instruction reflecting the selection.

At step S418, the CPU 30A judges whether a cancellation instruction to cancel post-processing has been received. If a cancellation instruction has been received, the CPU 30A executes the process shown in step S420 to cancel the post-processing. At step S422, the CPU 30A discards the series of slice image data at step S220. The series of slice data is discarded before generation of slice image data and control data.

If a cancellation instruction is not received at step S418, the CPU 30A executes the process shown in step S410 to generate a series of slice image data. At step S412, the CPU 30A generates a series of raster image data and outputs the generated series of raster image data to the image forming apparatus 12. At step S414, the CPU 30A generates a series of control data and outputs the generated series of control data to the post-processing apparatus 14.

In the above processing procedure, the CPU 30A receives an instruction of selection between cancellation and execution of post-processing from a user. Alternatively, the CPU 30A may cancel the post-processing without receiving a selection to that effect from a user if a detected separation region contains data of characters or the like.

(Selection Picture)

Figure 18:
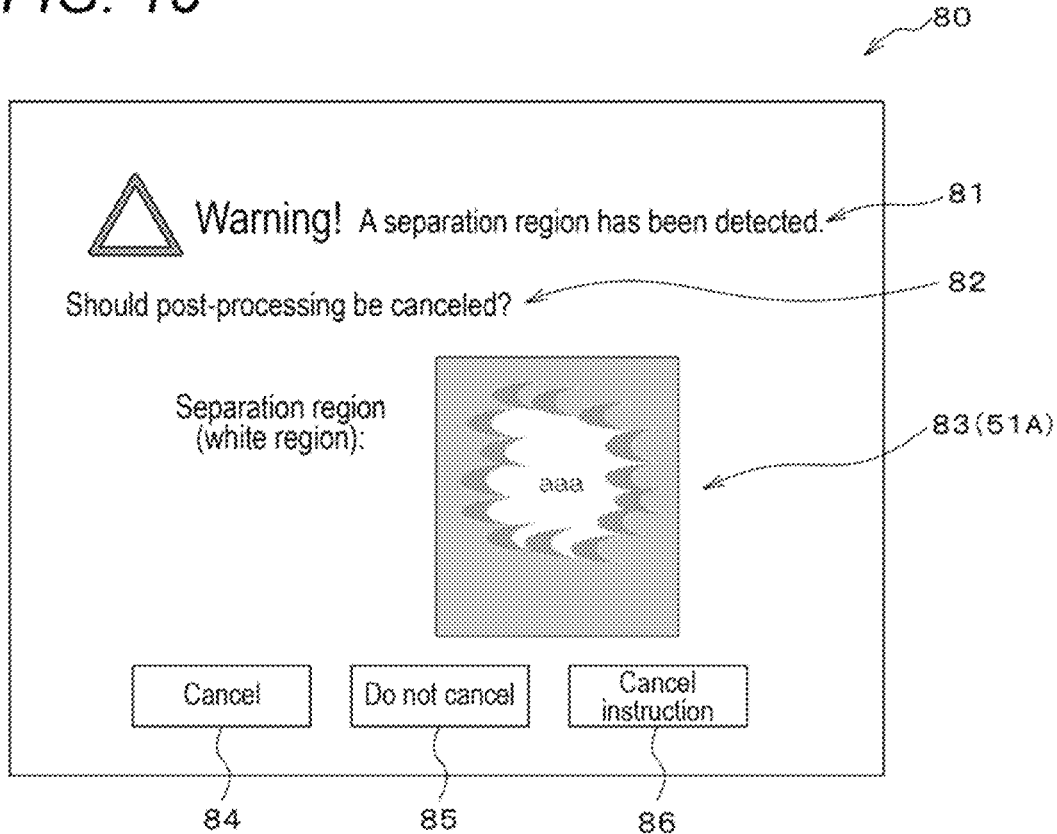
FIG. 18 is a schematic diagram showing an example selection picture.

The selection picture that is displayed at step S416 will be described below. FIG. 18 is a schematic diagram showing an example selection picture. As shown in FIG. 18, a selection picture 80 includes a warning 81 to the effect that a separation region (expected trouble) has been detected, a question 82 that asks whether to cancel post-processing, and a display 83 of a detected separation region.

In the illustrated example, a warning mark, a character string "Warning!" and a sentence "A separation region has been detected" are displayed as the warning 62. A sentence "Should post-processing be canceled" is displayed as the question 82. Cutting print data 51A containing the detected separation region are displayed as the display 83. As described later, a body region 57 is painted out in the cutting print data 51A.

Buttons 84-86 are also displayed as options for urging a user to input an instruction as to whether to cancel post-processing. The button 84 is a "cancel" button for inputting an instruction to cancel post-processing. The button 85 is a "do not cancel" button for inputting an instruction to execute post-processing. The button 86 is a "cancel instruction" button for inputting an instruction to cancel an instruction.

Looking at the warning picture, a user recognizes that the separation region (expected trouble) has been detected. Furthermore, looking at the displayed separation region, the user selects between cancellation and execution of post-processing on his or her own volition. To make an instruction to cancel post-processing, the user pushes the "cancel" button 84. On the other hand, to make an instruction to perform post-processing, the user pushes the "do not cancel" button 85.

(Separation Region Detection Process)

Figure 19:
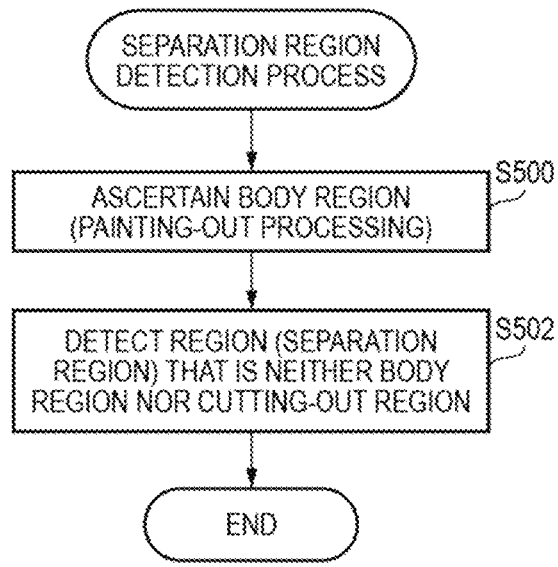
FIG. 19 is a flowchart showing an example processing procedure of a separation region detection process.

Next, the separation region detection process will be described. FIG. 19 is a flowchart showing an example processing procedure of the separation region detection process. As shown in FIG. 19, at step S500, the CPU 30A ascertains a body region by performing off-pixel, painting-out processing. At step S502, the CPU 30A detects, as a separation region, a region that is neither a body region nor a cutting-out region.

Figure 20A:
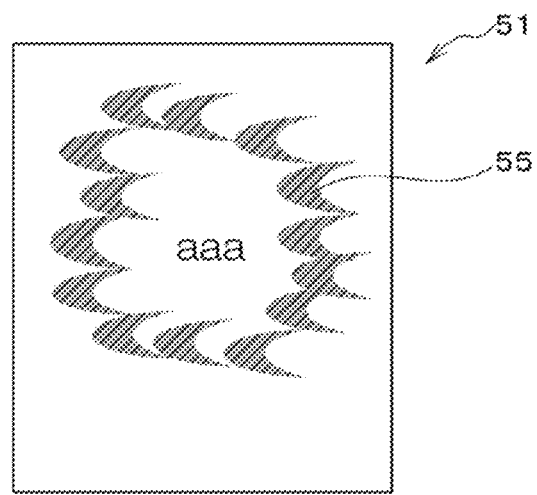
FIGS. 20A and 20B are schematic diagrams illustrating an example separation region detection method.
Figure 20B:
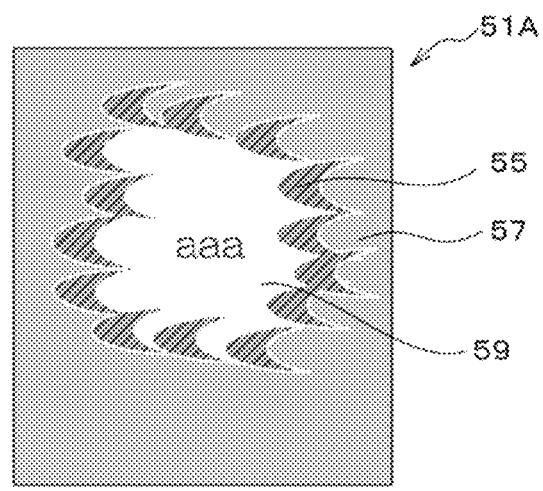

A specific separation region detection method will be described below. FIGS. 20A and 20B are schematic diagrams illustrating an example separation region detection method. As shown in FIG. 20A, cutting print data 51 has cutting-out regions 55 which are regions to be cut out of a recording medium 50. In the illustrated example, plural, crescent-shaped cutting-out regions 55 are arranged like a ring. Also in this example, hatched pixels are on-pixels and white pixels are off-pixels.

First, as shown in FIG. 20B, off-pixel painting-out processing is performed from an end of the cutting print data 51. The painted-out cutting print data 51 is referred to as cutting print data 51A. In the illustrated example, painting-out is performed in black. A body region 57, which is a region to remain to constitute the recording medium 50 even after the cutting-out region 55 is cut out of the recording medium 50, is connected to the recording medium 50. Thus, the painted-out region (consisting of black pixels) is recognized as a body region 57.

The cutting-out region 55 is hatched and the body region 57 is painted out in black. In the cutting print data 51A, the region that is neither the cutting-out region 55 nor the body region 57 is not painted out and remains consisting of white pixels. Thus, it is recognized that the region that is not painted out is a separation region 59.

Figures 21A, 21B:
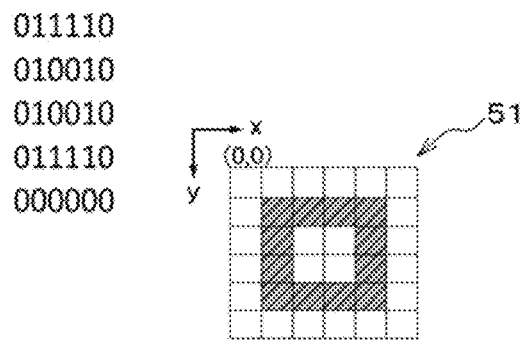
FIGS. 21A and 21B are schematic diagrams illustrating a painting-out process.
Figure 22:
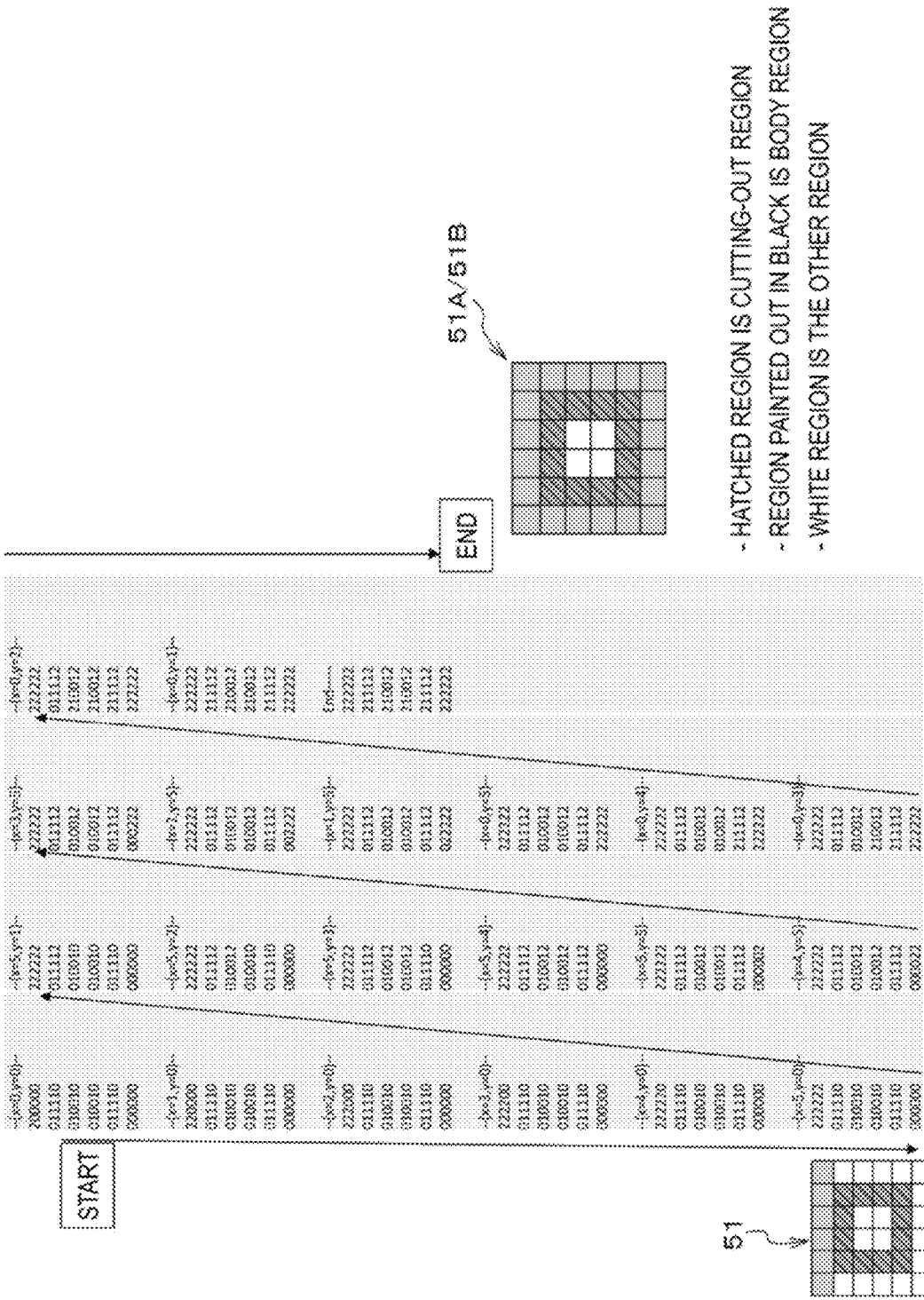
FIG. 22 is a schematic diagram showing an example result of the painting-out process.

The painting-out process that is used for ascertaining the body region 57 above will be described below. FIGS. 21A and 21B are schematic diagrams illustrating a painting-out process. FIG. 22 is a schematic diagram showing a result of the painting-out process. Assume that as shown in FIG. 21A cutting print data 51 are of an image of 6 pixels (row direction)×6 pixels (column direction). Each pixel is represented by (x, y). A hatched, hollow square region is a cutting-out region 55. Hatched pixels are on-pixels and white pixels are off-pixels. A group of data that are numerical values of raster image data are also shown in FIG. 21A. The on-pixels have a pixel value "1" and the off-pixels have a pixel value "0."

A body region 57 is determined by calling a region painting-out function shown in FIG. 21B recursively in order from an end (x=0, y=0) of cutting print data 51. As shown in FIG. 22, the pixel value of a pixel that has been judged to belong to the body region 57 is changed from "0" to "2." With this processing, a painted-out region expands from the off-pixel located at the end of the cutting print data 51 to nearby off-pixels progressively, whereby isolated off-pixels are left not painted out. In the illustrated example, only the off-pixels located outside the cutting-out region 55 are painted out and the off-pixels located inside the cutting-out region 55 are not painted out.

<Modification>

The above-described information processing apparatus, 3D modeling systems, and programs according to the exemplary embodiments are just examples, and it goes without saying that they can be modified without departing from the spirit and scope of the invention.

For example, although each of the above exemplary embodiments is directed to the 3D modeling system that is equipped with the 3D modeling post-processing apparatus, the post-processing apparatus having a cutting-out unit which performs a cutting-out operation is not limited to ones for 3D modeling. A post-processing apparatus having a cutting-out unit which performs a cutting-out operation may be disposed downstream of an ordinary image processing apparatus that performs image formation on the basis of 2D image data. The image forming apparatus 12 according to each of the exemplary embodiments can also be used as an ordinary image processing apparatus. A post-processing apparatus having a cutting-out unit which performs a cutting-out operation may be disposed downstream of the image forming apparatus 12.

Figure 23:
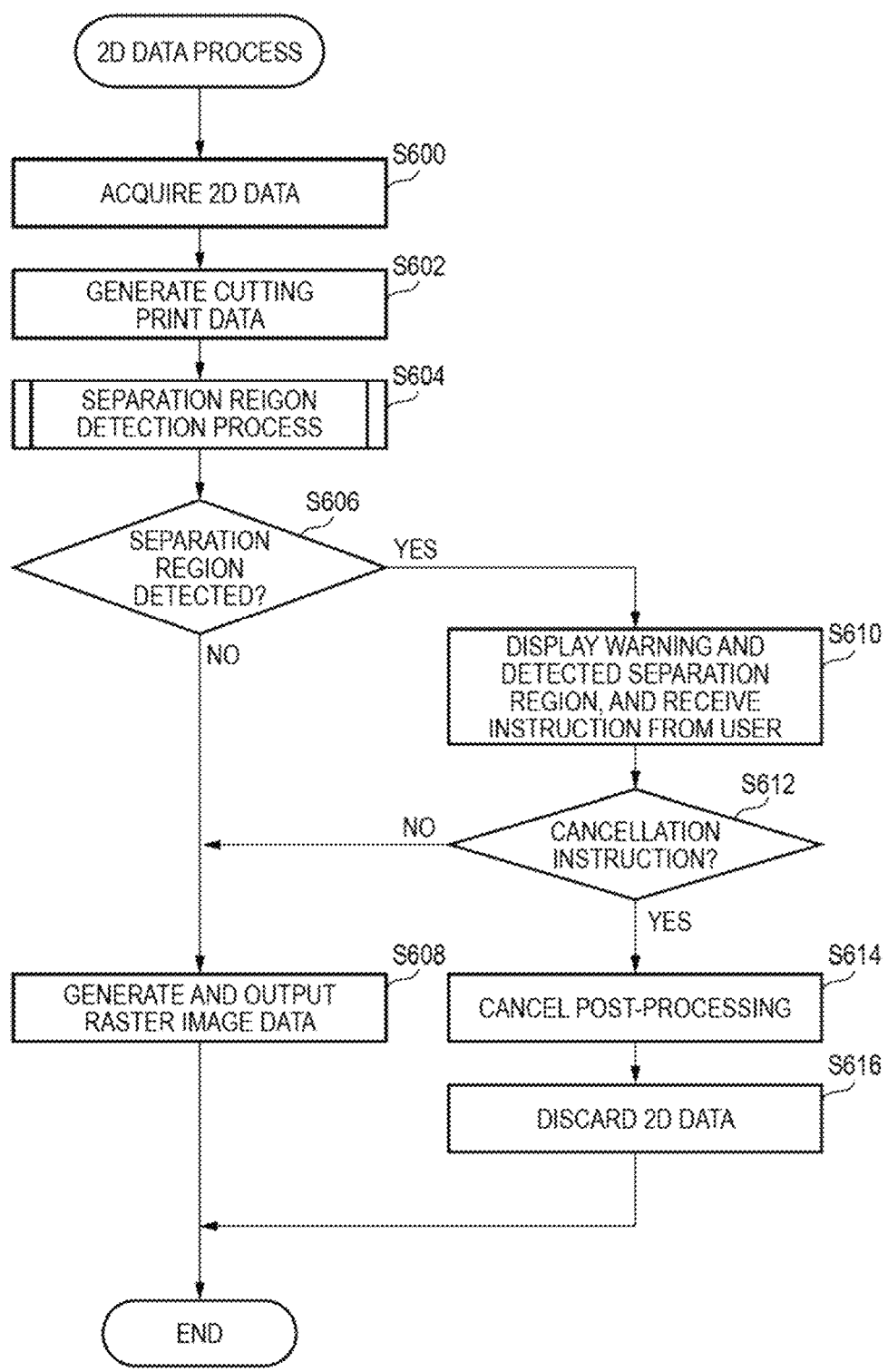
FIG. 23 is a flowchart showing an example processing procedure of a 2D data process according to Modification.

FIG. 23 is a flowchart, showing an example processing procedure of a 2D data process according to Modification. A program for executing the 2D data process is stored, in the ROM 30B of the information processing apparatus 10 and read out and executed by the CPU 30A of the information processing apparatus 10.

The CPU 30A of the information processing apparatus 10 acquires 2D data at step S600, generates cutting print data on the basis of the 2D data at step S602, and executes a separation detection process for detecting a separation region, if any, from the cutting print data generated at step S604. At step S606, the CPU 30A judges whether a separation region exists in the cutting print data.

If no separation region is found, the CPU 30A executes the process shown in step S608 to generate raster image data from the 2D data and output the generated raster image data to the image forming apparatus 12. The image forming apparatus 12 acquires the raster image data, and forms a 2D image on a recording medium 50.

On the other hand, if a separation region is detected at step S606, the CPU 30A executes the process shown in step S610 to display a selection picture to a user to thereby warn the user about the detection of the separation region (expected trouble). The selection picture includes options for urging the user to select between cancellation and execution of post-processing, and the CPU 30A receives an instruction from the user. The user selects between cancellation and execution of post-processing and inputs an instruction reflecting the selection. The CPU 30A may cancel the post-processing without receiving a selection to that effect from the user if a detected separation region contains data of characters or the like.

At step S612, the CPU 30A judges whether a cancellation instruction to cancel post-processing has been received. If a cancellation instruction has been received, the CPU 30A executes the process shown in step S614 to cancel the post-processing. At step S616, the CPU 30A discards the 2D data.

If a cancellation instruction is not received at step S612, the CPU 30A executes the process shown in step S608 to generate raster image data and output the generated raster image data to the image forming apparatus 12.

What is claimed is:

1. An information processing apparatus comprising:
a processor configured to:
detect, from slice data of each page of slice data of a plurality of pages obtained by slicing 3D data at a plurality of respective planes, expected trouble that may occur when 3D modeling post-processing is performed on a recording medium on which a slice image has been formed based on the slice data of the page, the detection including at least one of a first thin-line region that is a cutting-out region to be cut out of the recording medium and laid on a preceding cutting-out region and having a width that is smaller than or equal to a threshold value and a second thin-line region that is interposed between adjacent cutting-out regions and having a width that is smaller than or equal to a threshold value; and
warn a user about the detection of the expected trouble.

2. The information processing apparatus according to claim 1, wherein the 3D modeling post-processing is canceled in case where the processor detects at least one of the first thin-line region and the second thin-line region.

3. The information processing apparatus according to claim 1, wherein the processor is configured to detect, as the expected trouble, a separation region that is not a cutting-out region to be cut out of the recording medium and laid on a preceding cutting-out region and that is to be separated from the recording medium.

4. The information processing apparatus according to claim 3, wherein in case where the processor detects the separation region, a selection picture that urges the user to select between cancellation and execution of the 3D modeling post-processing is displayed to the user.

5. The information processing apparatus according to claim 4, wherein an image of the separation region is displayed in the selection picture.

6. A 3D modeling system comprising:
the information processing apparatus according to claim 1;
an image forming apparatus configured to form slice images on respective recording media based on image formation information generated by the information processing apparatus; and
a 3D modeling post-processing apparatus configured to perform 3D modeling post-processing on the recording media on which the slice images are formed, according to control data corresponding to the respective slice images.

7. An information processing apparatus comprising:
a processor configured to:
detect a separation region that is not a predetermined cutting-out region and is to be separated from a recording medium on which a 2D image is formed when the predetermined cutting-out region is cut out of the recording medium, the detection including at least one of a first thin-line region that is a cutting-out region to be cut out of the recording medium and laid on a receding cutting-out region and having a width that is smaller than or equal to a threshold value and a second thin-line regio that is interposed between adjacent cutting-out regions and having a width that is smaller than or equal to a threshold value; and
warn a user about the detection of the separation region.

8. A non-transitory computer readable medium storing a program for causing a computer to execute a process for information processing, the process comprising:
detecting, from slice data of each page of slice data of a plurality of pages obtained by slicing 3D data at a plurality of respective planes, expected trouble that may occur when 3D modeling post-processing is performed on a recording medium on which a slice image has been formed based on the slice data of the page, the detection including at least one of a first thin-line region that is a cutting-out region to be cut out of the recording medium and laid on a preceding cutting-out region and having a width that is smaller than or equal to a threshold value and a second thin-line region that is interposed between adjacent cutting-out regions and having a width that is smaller than or equal to a threshold value; and
warning a user about the detection of the expected trouble.

* * * * *